(12) United States Patent
Limaye et al.

(10) Patent No.: US 11,664,057 B2
(45) Date of Patent: May 30, 2023

(54) MULTIPLEXED MEMORY DEVICE INTERFACE AND METHOD

(71) Applicant: Micron Technology, Inc., Boise, ID (US)

(72) Inventors: Aparna U. Limaye, Boise, ID (US); Timothy Mowry Hollis, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/374,601

(22) Filed: Jul. 13, 2021

(65) Prior Publication Data

US 2022/0020403 A1 Jan. 20, 2022

Related U.S. Application Data

(60) Provisional application No. 63/051,726, filed on Jul. 14, 2020.

(51) Int. Cl.
*G11C 7/10* (2006.01)
*G11C 5/06* (2006.01)

(52) U.S. Cl.
CPC ............ *G11C 7/1012* (2013.01); *G11C 5/06* (2013.01); *G11C 7/109* (2013.01); *G11C 7/1039* (2013.01); *G11C 7/1063* (2013.01)

(58) Field of Classification Search
CPC ....... G11C 7/1012; G11C 5/06; G11C 7/1039; G11C 7/1063; G11C 7/109; G11C 7/1057; G11C 7/1084; G11C 5/025; G11C 5/066
USPC .................................................. 365/189.02
See application file for complete search history.

(56) References Cited

U.S. PATENT DOCUMENTS

| | | | |
|---|---|---|---|
| 8,984,189 B2 | 3/2015 | Casper et al. | |
| 2006/0126369 A1 | 6/2006 | Raghuram | |
| 2009/0059641 A1* | 3/2009 | Jeddeloh | H01L 25/0657 365/63 |
| 2013/0077382 A1 | 3/2013 | Cho et al. | |
| 2013/0094301 A1* | 4/2013 | Min | G11C 7/1084 257/782 |
| 2015/0131388 A1* | 5/2015 | Ware | G11C 11/4082 365/189.05 |
| 2017/0178988 A1* | 6/2017 | Cheney | H01L 23/295 |
| 2017/0206036 A1* | 7/2017 | Pax | G06F 3/0688 |
| 2018/0102344 A1* | 4/2018 | Ramachandra | G11C 7/22 |
| 2019/0103148 A1* | 4/2019 | Hasbun | G11C 7/10 |

(Continued)

OTHER PUBLICATIONS

"International Application Serial No. PCT US2021 041445, International Search Report dated Nov. 2, 2021", 4 pgs.

(Continued)

*Primary Examiner* — Fernando Hidalgo
(74) *Attorney, Agent, or Firm* — Schwegman Lundberg & Woessner, P.A.

(57) ABSTRACT

Apparatus and methods are disclosed, including memory devices and systems. Example memory devices, systems and methods include a buffer to translate high speed data interactions on a host interface side into slower, wider data interactions on a DRAM interface side. Example memory devices, systems and methods include a multiplexer circuit to further facilitate use of slower, and wider bandwidth memory devices. Devices and methods described may be configured to substantially match the capacity of a narrower, higher speed host interface.

26 Claims, 13 Drawing Sheets

(56) References Cited

U.S. PATENT DOCUMENTS

2019/0361998 A1* 11/2019 Meron ................ G06F 16/9017
2021/0027820 A1* 1/2021 Huang ................ G11C 11/4076

OTHER PUBLICATIONS

"International Application Serial No. PCT US2021 041445, Written Opinion dated Nov. 2, 2021", 6 pgs.

* cited by examiner

MULTIPLEXED MEMORY DEVICE INTERFACE AND METHOD

PRIORITY APPLICATION

This application claims the benefit of priority to U.S. Provisional Application Ser. No. 63/051,726, filed Jul. 14, 2020, which is incorporated herein by reference in its entirety.

BACKGROUND

Memory devices are semiconductor circuits that provide electronic storage of data for a host system (e.g., a computer or other electronic device). Memory devices may be volatile or non-volatile. Volatile memory requires power to maintain data, and includes devices such as random-access memory (RAM), static random-access memory (SRAM), dynamic random-access memory (DRAM), or synchronous dynamic random-access memory (SDRAM), among others. Non-volatile memory can retain stored data when not powered, and includes devices such as flash memory, read-only memory (ROM), electrically erasable programmable ROM (EEPROM), erasable programmable ROM (EPROM), resistance variable memory, such as phase change random access memory (PCRAM), resistive random-access memory (RRAM), or magnetoresistive random access memory (MRAM), among others.

Host systems typically include a host processor, a first amount of main memory (e.g., often volatile memory, such as DRAM) to support the host processor, and one or more storage systems (e.g., often non-volatile memory, such as flash memory) that provide additional storage to retain data in addition to or separate from the main memory.

A storage system, such as a solid-state drive (SSD), can include a memory controller and one or more memory devices, including a number of dies or logical units (LUNs). In certain examples, each die can include a number of memory arrays and peripheral circuitry thereon, such as die logic or a die processor. The memory controller can include interface circuitry configured to communicate with a host device (e.g., the host processor or interface circuitry) through a communication interface (e.g., a bidirectional parallel or serial communication interface). The memory controller can receive commands or operations from the host system in association with memory operations or instructions, such as read or write operations to transfer data (e.g., user data and associated integrity data, such as error data or address data, etc.) between the memory devices and the host device, erase operations to erase data from the memory devices, perform drive management operations (e.g., data migration, garbage collection, block retirement), etc.

It is desirable to provide improved main memory, such as DRAM memory. Features of improved main memory that are desired include, but are not limited to, higher capacity, higher speed, and reduced cost.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Figure 1A:
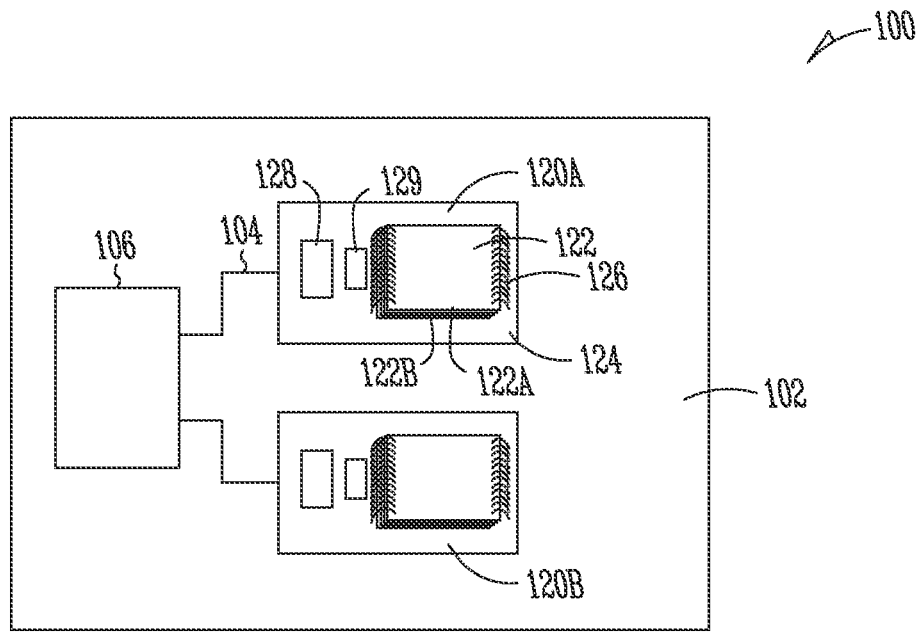
FIG. 1A illustrates a system including a memory device in accordance with some example embodiments.

FIG. 1A shows an electronic system 100, having a processor 106 coupled to a substrate 102. In some examples substrate 102 can be a system motherboard, or in other examples, substrate 102 may couple to another substrate, such as a motherboard. Electronic system, 100 also includes first and second memory devices 120A, 120B. Memory devices 120A, 120B are also shown supported by substrate 102 adjacent to the processor 106 but are depicted, in an example configuration, coupled to a secondary substrate

124. In other examples, memory devices 120A, 120B can be coupled directly to the same substrate 102 as processor 106.

The memory devices 120A, 120B, each include a buffer 128, coupled to a secondary substrate 124. In this example, and other examples in the present disclosure, the buffer may be included in a buffer die. In this example, and other examples in the present disclosure, the buffer may be in another circuit form, apart from a die. The memory devices 120A, 120B each include one or more memory devices 122. Although the invention is not so limited, in selected examples shown, the memory devices 122 shown are included in a stack of memory devices 122. For purposes of the present description, stacked memory devices will be described as one example configuration in which the memory devices are dynamic random access memory (DRAM) dies 122A, 122B. In the example of FIG. 1A, the memory dies 122A, 122B are each coupled to the secondary substrate 124. Other types of memory devices may be used in place of DRAM, including, for example FeRAM, phase change memory (PCM), 3D XPoint™ memory, NAND memory, or NOR memory, or a combination thereof. In some cases, a single memory device (120A, 120B) may include one or more memory die that uses a first memory technology (e.g., DRAM) and a second memory die that uses a second memory technology (e.g., SRAM, FeRAM, etc.) different from the first memory technology. In one example, the one or more memory dies are configured to operate under DDR5 protocol. In one example, the one or more memory dies are configured to operate under DDR6 protocol. Examples of DDR6 protocol include power consumption of 1.3 watts, transfer speeds up to 16 Gbps, and bandwidth of up to 72 GB per second.

Although DDR5 and DDR6 are noted as examples of operating protocol, other protocols are also within the scope of the invention.

The stack of one or more memory devices 122 are shown in block diagram form in FIG. 1. Other figures in the following description shown greater detail of stacks of dies and various stacking configurations. In the example of FIG. 1A, a number of wire bonds 126 are shown coupled to the one or more memory devices 122. Additional circuitry (not shown) is included on or within the substrate 124. The additional circuitry completes the connection between the one or more memory devices 122, through the wire bonds 126, to the buffer 128. Selected examples may include through silicon vias (TSVs) instead of wire bonds 126 as will be described in more detail in subsequent figures.

A multiplexer circuit 129 is shown coupled between the one or more memory devices 122 and the buffer 128. In the example of FIG. 1A, the multiplexer circuit 129 is a separate circuit from the buffer 128, however the invention is not so limited. In one example, the multiplexer circuit 129 and the buffer 128 are both parts of one integrated circuit. In one example, the multiplexer circuit 129 and the buffer 128 are integrated into a single die. In one example, the multiplexer circuit 129 is integrated into a buffer.

In the present disclosure, the term "coupled between" refers to operative coupling, and not necessarily to a physical location. When the multiplexer circuit 129 is described as coupled between the one or more memory devices 122 and the buffer 128, in means that data must pass through the multiplexer circuit 129 when traveling either from the one or more memory devices 122 to the buffer 128, or when travelling from the buffer 128 to the one or more memory devices 122.

Memory device configurations that include a buffer 128 between one or more memory devices 122 and a processor 106 are able to operate with wider bandwidth, slower memory devices 122 on one side of the buffer 128 and a faster interface between the processor and the buffer. This configuration allows slower and less expensive memory devices 122, for example wire bond connected memory devices 122 to be used more efficiently. The additional element of the multiplexer circuit 129 between the one or more memory devices 122 and the buffer 128 adds to this advantage, and further allows wider bandwidth, slower memory devices or dies to efficiently interface with the buffer 128, and ultimately the processor 106. Data and/or command address information from two or more wider and slower memory devices or dies can be multiplexed into a single pin at a processor side of the buffer. This increases energy efficiency over configurations with only a buffer coupled directly to one or more memory devices 122.

Figure 1B:
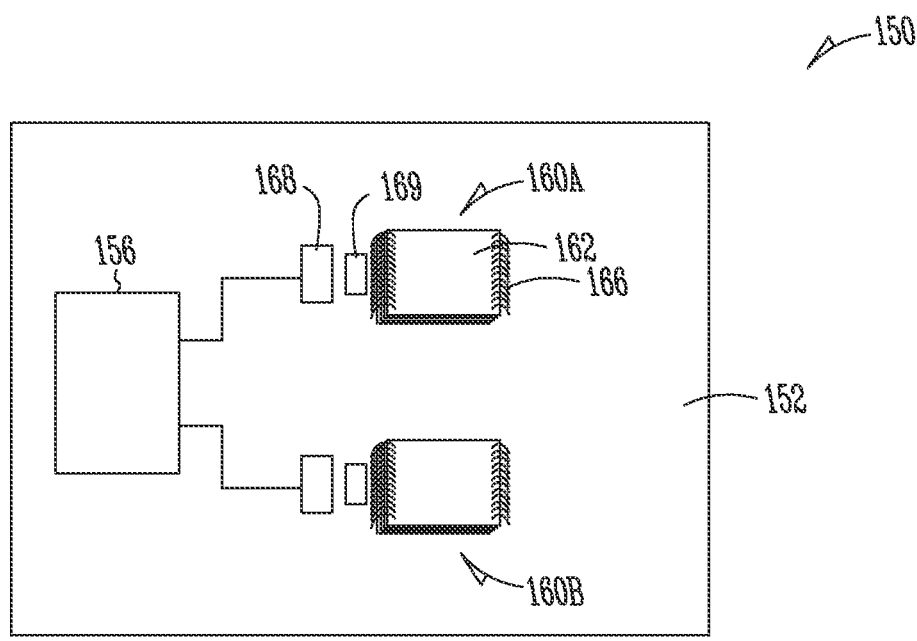
FIG. 1B illustrates another system including a memory device in accordance with some example embodiments.

Substrate wiring 104 is shown coupling the memory device 120A to the processor 106. In the example of FIG. 1B, an additional memory device 120B is shown. Although two memory devices 120A, 120B are shown for the depicted example, a single memory structure may be used, or a number of memory devices greater than two may be used. Examples of memory devices as described in the present disclosure provide increased capacity near memory with increased speed and reduced manufacturing cost.

In one example, multiple memory devices each include a buffer coupled to multiple memory dies. A multiplexer circuit is coupled between the processor and the buffers of the multiple memory devices. This configuration provides added efficiency over examples without a multiplexer circuit, however, examples with the multiplexer circuit coupled between the buffer and the one or more memory devices is more efficient.

FIG. 1B shows an electronic system 150, having a processor 156 coupled to a substrate 152. The system 150 also includes first and second memory devices 160A, 160B. In contrast to FIG. 1A, in FIG. 1B, the first and second memory devices 160A, 160B are directly connected to the same substrate 152 as the processor 156, without any intermediary substrates or interposers. This configuration can provide additional speed and reduction in components over the example of FIG. 1A. Similar to the example of FIG. 1A, a buffer 168 is shown adjacent to one or more memory devices 162. A multiplexer circuit 169 is shown coupled between the buffer 168 and the memory devices 162. Wire bonds 166 are shown as an example interconnection structure, however other interconnection structures such as TSVs may be used.

Figure 1C:
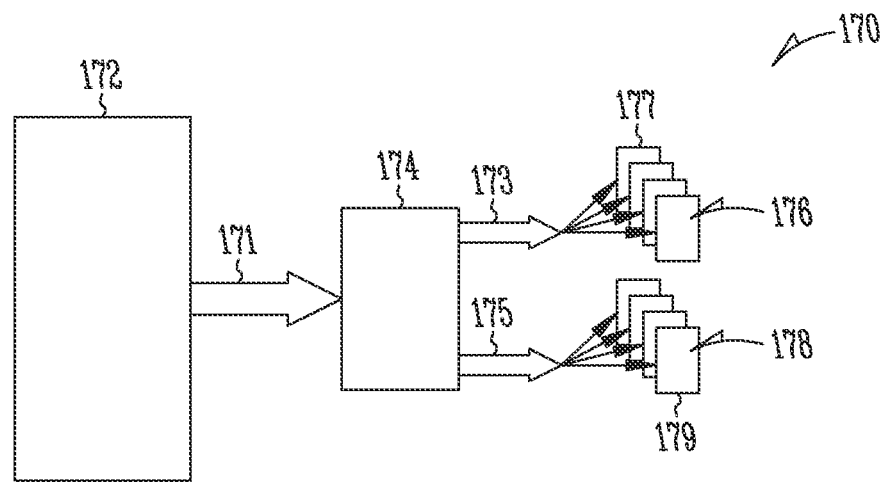
FIG. 1C illustrates a block diagram of a memory device in accordance with some example embodiments.

FIG. 1C shows a block diagram 170 of a memory device according to one example. A buffer 172 is shown that is in communication with multiple memory dies 177, 179. In the example shown, a first stack 176 of dies 177 and a second stack 178 of dies 179 are shown. The first stack 176 is coupled to a multiplexer circuit 174, and the second stack 178 is also coupled to the multiplexer circuit 174. In the example of FIG. 1C, the multiplexer circuit 174 interfaces with four dies 177 in the first stack 176 and combines their data into one data pathway 173. Likewise, the multiplexer circuit 174 interfaces with four dies 179 in the second stack 178 and combines their data into one data pathway 175. The two pathways 173, 175 are further combined into a buffer pathway 171. As shown, the use of a multiplexer circuit 174 increases the number of dies 177, 179 that can be interfaced with into a limited number of pins on the buffer 172.

In one example, the data pathways 173, 175 and 171 multiplex data pins (DQ pins). In one example, the data pathways 173, 175 and 171 multiplex command/address pins (CA pins). In one example, the data pathways 173, 175 and 171 multiplex a combination of DQ and CA pins. More detail regarding configurations and operation of DQ and CA pins is included in discussion of various examples below.

In one example, one CA pin is used to select between multiple stacks and/or multiple dies. An advantage of this configuration, is that it removes the need for CA pins to be multiplexed. In one example, the one CA pin is a dedicated CA pin that provides the selection of device in the multiplexed stream.

In the diagram of FIG. 1C, no specific mounting location is specified for the dies 177, 179, the multiplexer circuit 174, and the buffer 172. For example, these components may be mounted separately on one or more circuit boards, and may be manufactured separately.

Figure 1D:
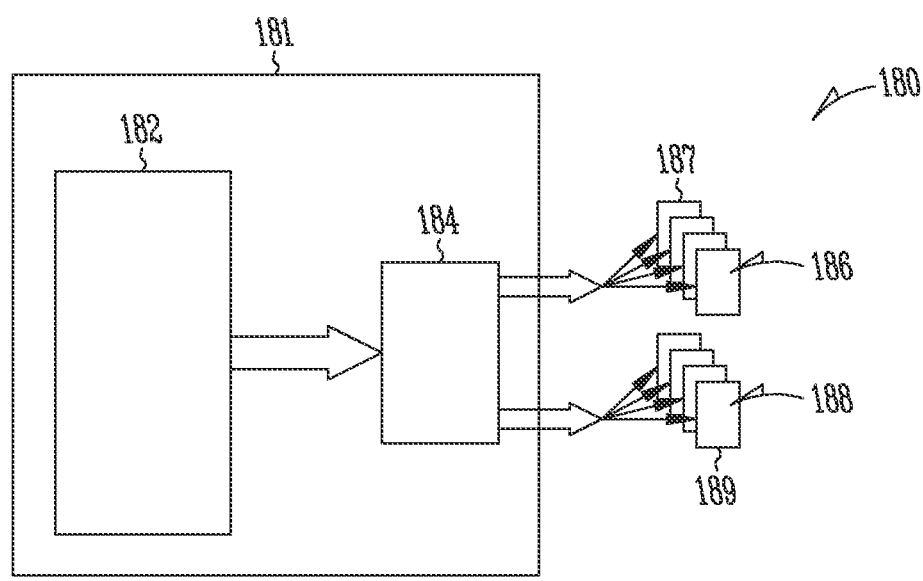
FIG. 1D illustrates another block diagram of a memory device in accordance with some example embodiments.

FIG. 1D shows a block diagram 180 of a memory device similar to the memory device of FIG. 1C. A buffer 182 is shown that is in communication with multiple memory dies 187, 189. In the example shown, a first stack 186 of dies 187 and a second stack 188 of dies 189 are shown. The first stack 186 is coupled to a multiplexer circuit 184, and the second stack 188 is also coupled to the multiplexer circuit 184. In the example of FIG. 1D, both the buffer 182 and the multiplexer circuit 184 are formed on a single die 181.

Figure 1E:
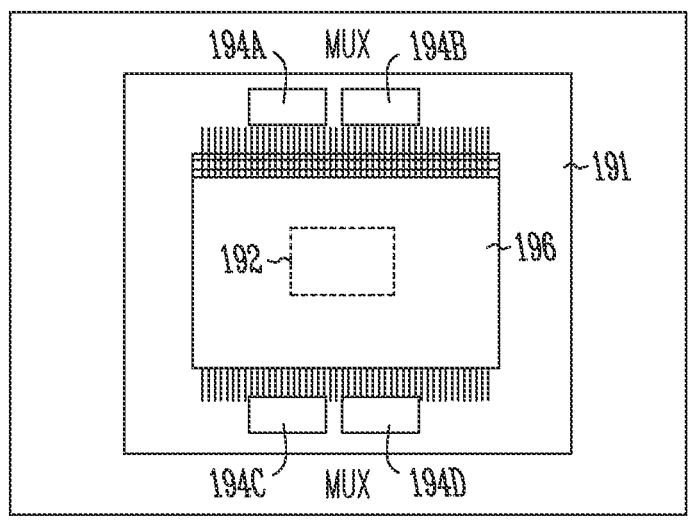
FIG. 1E illustrates another block diagram of a memory device in accordance with some example embodiments.

FIG. 1E shows another configuration of a memory device 190 according to one example. In FIG. 1E, a stack of memory dies 196 is coupled to a substrate 191. A buffer 192 is located beneath the stack of memory dies 196. In one example the buffer 192 is in the form of a buffer, although the invention is not so limited.

In the example of FIG. 1E, a number of multiplexer circuits are coupled between the buffer 192 and the stack of memory dies 196. A first multiplexer circuit 194A, second multiplexer circuit 194B, third multiplexer circuit 194C, and fourth multiplexer circuit 194D are shown. Although four multiplexer circuits are shown the invention is not so limited. In one example, multiple multiplexer circuits are used to vary the number of memory dies that must be multiplexed by any one given multiplexer circuit. Other possible numbers of multiplexer circuits include one multiplexer circuit, two, three, or more than four multiplexer circuits. The selected number of multiplexer circuits may depend on the number of memory dies in a given device 190.

Other possible numbers of multiplexer circuits include one multiplexer circuit, two, three, or more than four multiplexer circuits. In one example, the multiplexer circuits are not limited to a 1:2 ratio (one input to two outputs). Other examples include 1:3, 1:4, etc. depending on the arrangement and/or combination of inputs and outputs of discrete multiplexer devices. For example, inputs to multiple multiplexer devices may be common or independent.

Figure 2:
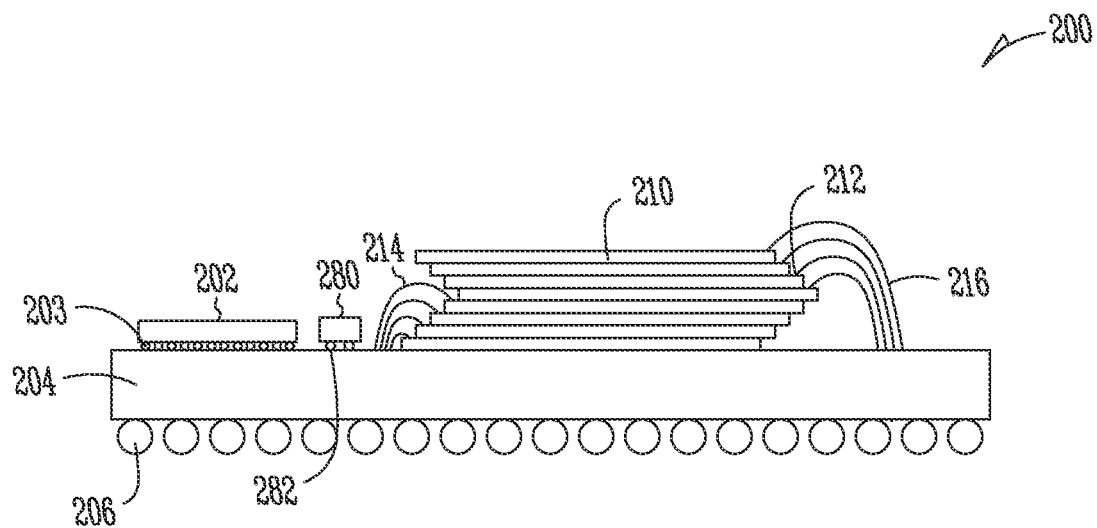
FIG. 2 illustrates an example memory device in accordance with some example embodiments.

FIG. 2 shows a memory system 200 similar to memory device 120A or 120B from FIG. 1A. The memory device 200 includes a buffer 202 coupled to a substrate 204. The memory device 200 also includes a stack of DRAM dies 210 coupled to the substrate 204. In the example of FIG. 2, the individual dies in the stack of DRAM dies 210 are laterally offset from one or more vertically adjacent die specifically, in the depicted example, each die is laterally offset from both vertically adjacent die. As an example, the die may be staggered in at least one stair step configuration. The Example of FIG. 2 shows two different stagger directions in the stair stepped stack of DRAM dies 210. In the illustrated duel stair step configuration, an exposed surface portion 212 of each die is used for a number of wire bond interconnections.

Multiple wire bond interconnections 214, 216 are shown from the dies in the stack of DRAM dies 210 to the substrate 204. Additional conductors (not shown) on or within the substrate 204 further couple the wire bond interconnections 214, 216 to the buffer 202. The buffer 202 is shown coupled to the substrate 204 using one or more solder interconnections 203, such as a solder ball array. A number of substrate solder interconnections 206 are further shown on a bottom side of the substrate 204 to further transmit signals and data from the buffer into a substrate 102 and eventually to a processor 106 as shown in FIG. 1B.

A multiplexer circuit 280 is shown coupled to the substrate 204 with one or more solder balls 282. The multiplexer circuit 280 is coupled between the buffer 202 and the stack of DRAM dies 210. Although the multiplexer circuit 280 is shown physically located between the buffer 202 and the stack of DRAM dies 210, the invention is not so limited. Although specific wiring is not shown in the Figure, the multiplexer circuit 280 is operationally coupled between the buffer 202 and the stack of DRAM dies 210, similar to the operational coupling described above.

Figure 3:
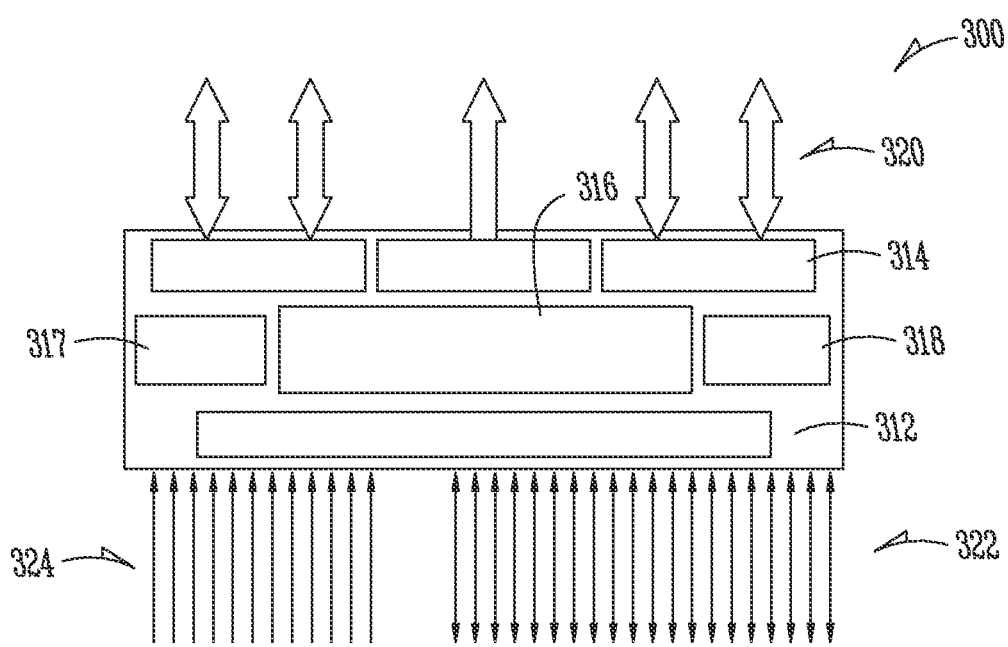
FIG. 3 illustrates a buffer in block diagram form in accordance with some example embodiments.

FIG. 3 shows a block diagram of a buffer 300 similar to buffer 202 from FIG. 2. A host device interface 312 and a DRAM interface 314 are shown. Additional circuitry components of the buffer 300 may include a controller and switching logic 316, row address select (RAS) logic 317, and built in self-test (BIST) login 318. Communication from the buffer 300 to a stack of DRAM dies is indicated by arrows 320. Communication from the buffer 300 to a host device is indicated by arrows 322 and 324. If FIG. 3, arrows 322 denote communication from command/address (CA) pins, and arrows 324 denote communication from data (DQ) pins 322. Example numbers of CA pins and DQ pins are provided only as examples, as the host device interface may have substantially greater or fewer of either or both CA and DQ pins. The number of pins of either type required may vary depending upon the width of the channel of the interface, the provision for additional bits (for example ECC bits), among many other variables. In many examples, the host device interface will be an industry standard memory interface (either expressly defined by a standard-setting organization, or a de facto standard adopted in the industry).

In one example, all CA pins 324 act as a single channel, and all data pins 322 act as a single channel. In one example, all CA pins 324 service all data pins 322. In another example, the CA pins 324 are subdivided into multiple sub-channels. In another example, the data pins 322 are subdivided into multiple sub-channels. One configuration may include a portion of the CA pins 324 servicing a portion of the data pins 322. In one specific example, 8 CA pins service 9 data pins as a sub-combination of CA pins and data pins. Multiple sub-combinations such as the 8 CA pin/9 data pin example, may be included in one memory device.

In operation, a possible data speed from a host device may be higher than interconnection components to DRAM dies such as trace lines, TSVs, wire bonds, etc. can handle. The addition of a buffer 300 (or other form of buffer assembly) allows fast data interactions from a host device to be buffered. In the example of FIG. 3, the host interface 312 is configured to operate at a first data speed. In one example, the first data speed may match the speed that the host device is capable of delivering.

In one example, the DRAM interface 314 is configured to operate at a second data speed, slower than the first data speed. In one example, the DRAM interface 314 is configured to be both slower and wider than the host interface 312. In operation, the buffer may translate high speed data interactions on the host interface 312 side into slower, wider data interactions on the DRAM interface 314 side. Additionally, as further described below, to maintain data throughput at least approximating that of the host interface, in some examples, the buffer assembly can reallocate the connections of the host interface to multiple sub-channels associated with respective DRAM interfaces. The slower, and wider DRAM interface 314 may be configured to substantially match the capacity of the narrower, higher speed host interface 312. In this way, more limited interconnection components to DRAM dies such as trace lines, TSVs, wire bonds, etc. are able to handle the capacity of interactions supplied from the faster host device.

The additional element of the multiplexer circuit between the one or more memory devices and a buffer adds to this advantage, and further allows wider bandwidth, slower memory devices or dies to efficiently interface with the buffer, and ultimately a processor. Data and/or command address information from two or more wider and slower memory devices or dies can be multiplexed into a single pin at the buffer. This increases efficiency over configurations with only a buffer coupled directly to one or more memory devices. The addition of a multiplexer circuit also reduces a pin count requirement on the buffer. This can be an important advantage, as pin count requirements can be high depending on the number of memory devices as described in more detail below.

Though one example host interface (with both CA pins and DQ pins) to buffer 300 is shown, buffer 300 may include multiple host interfaces for separate data paths that are each reallocated by buffer 300 to multiple DRAM interfaces, in a similar manner.

In one example, the host device interface 312 includes a first number of data paths, and the DRAM interface 314 includes a second number of data paths greater than the first number of data paths. In one example, circuitry in the buffer 300 maps data and commands from the first number of data paths to the second number of data paths. In such a configuration, the second number of data paths provide a slower and wider interface, as described above.

In one example the command/address pins 324 of the host device interface 312 include a first number of command/address paths, and on a corresponding DRAM interface 314 side of the buffer 300, the DRAM interface 314 includes a second number of command/address paths that is larger than the first number of command/address paths. In one example, the second number of command/address paths is twice the first number of command/address paths. In one example, the second number of command/address paths is more than twice the first number of command/address paths. In one example, the second number of command/address paths is four times the first number of command/address paths. In one example, the second number of command/address paths is eight times the first number of command/address paths.

In one example, a given command/address path on the DRAM interface 314 side of the buffer 300 is in communication with only a single DRAM die. In one example, a given command/address path on the DRAM interface 314 side of the buffer 300 is in communication with multiple DRAM dies. In one example, a given command/address path on the DRAM interface 314 side of the buffer 300 is in communication with 4 DRAM dies. In one example, a given command/address path on the DRAM interface 314 side of the buffer 300 is in communication with 16 DRAM dies. In one example, the command/address paths on the DRAM interface 314 side of the buffer 300 are multiplexed.

In one example the data pins 322 of the host device interface 312 include a first number of data paths, and on a corresponding DRAM interface 314 side of the buffer 300, the DRAM interface 314 includes a second number of data paths that is larger than the first number of data paths. In one example, the second number of data paths is twice the first number of data paths. In one example, the second number of data paths is more than twice the first number of data paths. In one example, the second number of data paths is four times the first number of data paths. In one example, the second number of data paths is eight times the first number of data paths. In one example, the second number of data paths on the DRAM interface 314 side of the buffer 300 are multiplexed.

In one example, a data path on the DRAM interface 314 side of the buffer 300 is in communication with only a single DRAM die. In one example, a given data path on the DRAM interface 314 side of the buffer 300 is in communication with multiple DRAM dies. In one example, a given data path on the DRAM interface 314 side of the buffer 300 is in communication with 4 DRAM dies. In one example, a given data path on the DRAM interface 314 side of the buffer 300 is in communication with 16 DRAM dies. In one example, the second number of data paths on the DRAM interface 314 side of the buffer 300 are multiplexed.

In one example, the host interface 312 includes different speeds for command/address pins 324, and for data pins 322. In one example, data pins 322 of the host interface are configured to operate at 6.4 Gb/s. In one example, command/address pins 324 of the host interface are configured to operate at 3.2 Gb/s.

In one example, the DRAM interface 314 of the buffer 300 slows down and widens the communications from the host interface 312 side of the buffer 300. In one example, where a given command/address path from the host interface 312 is mapped to two command/address paths on the DRAM interface 314, a speed at the host interface is 3.2 Gb/s, and a speed at the DRAM interface 314 is 1.6 Gb/s.

In one example, where a given data path from the host interface 312 is mapped to two data paths on the DRAM interface 314, a speed at the host interface is 6.4 Gb/s, and a speed at the DRAM interface 314 is 3.2 Gb/s, where each data path is in communication with a single DRAM die in a stack of DRAM dies. In one example, where a given data path from the host interface 312 is mapped to four data paths on the DRAM interface 314, a speed at the host interface is 6.4 Gb/s, and a speed at the DRAM interface 314 is 1.6 Gb/s, where each data path is in communication with four DRAM dies in a stack of DRAM dies. In one example, where a given data path from the host interface 312 is mapped to eight data paths on the DRAM interface 314, a speed at the host interface is 6.4 Gb/s, and a speed at the DRAM interface 314 is 0.8 Gb/s, where each data path is in communication with 16 DRAM dies in a stack of DRAM dies.

In one example, a pulse amplitude modulation (PAM) protocol is used to communicate on the DRAM interface 314 side of the buffer 300. In one example, the PAM protocol includes PAM-4, although other PAM protocols are within the scope of the invention. In one example, the PAM protocol increases the data bandwidth. In one example, where a given data path from the host interface 312 is mapped to four data paths on the DRAM interface 314, a speed at the host interface is 6.4 Gb/s, and a speed at the DRAM interface 314 is 0.8 Gb/s using a PAM protocol, where each data path is in communication with four DRAM dies in a stack of DRAM dies. In one example, where a given data path from the host interface 312 is mapped to eight data paths on the DRAM interface 314, a speed at the host interface is 6.4 Gb/s, and a speed at the DRAM interface 314 is 0.4 Gb/s using a PAM protocol, where each data path is in communication with 16 DRAM dies in a stack of DRAM dies.

A number of pins needed to communicate between the buffer 300 and an example 16 DRAM dies varies depending on the number of command/address paths on the DRAM interface 314 side of the buffer 300, and on the number of DRAM dies coupled to each data path. The following table show a number of non-limiting examples of pin counts and corresponding command/address path configurations for configurations without a multiplexer circuit. Example configurations that include one or more multiplexer circuits are able to reduce the pin requirement significantly.

| host CA paths | host speed (Gb/s) | DRAM CA paths | DRAM speed (Gb/s) | # dies coupled to DRAM path | # pins |
|---|---|---|---|---|---|
| 15 | 3.2 | 30 | 1.6 | 16 | 480 |
| 15 | 3.2 | 30 | 1.6 | 4 | 120 |
| 15 | 3.2 | 30 | 1.6 | 16 | 30 |
| 15 | 3.2 | 30 | 0.8 PAM-4 | 4 | 120 |
| 15 | 3.2 | 30 | 0.8 PAM-4 | 16 | 30 |

A number of pins needed to communicate between the buffer 300 and an example 16 DRAM dies varies depending on the number of data paths on the DRAM interface 314 side of the buffer 300, and on the number of DRAM dies coupled to each data path. The following table show a number of non-limiting examples of pin counts and corresponding data path configurations for configurations without a multiplexer circuit. Example configurations that include one or more multiplexer circuits are able to reduce the pin requirement significantly.

| host data paths | host speed (Gb/s) | DRAM data paths | DRAM speed (Gb/s) | # dies coupled to DRAM path | # pins |
|---|---|---|---|---|---|
| 36 | 6.4 | 72 | 3.2 | 1 | 1152 |
| 36 | 6.4 | 144 | 1.6 | 4 | 576 |
| 36 | 6.4 | 288 | 0.8 | 16 | 288 |
| 36 | 6.4 | 144 | 0.8 PAM-4 | 4 | 576 |
| 36 | 6.4 | 288 | 0.4 PAM-4 | 16 | 288 |

As illustrated in selected examples below, the number of pins in the above tables may be coupled to the DRAM dies in the stack of DRAM dies in a number of different ways. In one example, wire bonds are used to couple from the pins to the number of DRAM dies. In one example, TSVs are used to couple from the pins to the number of DRAM dies. Although wire bonds and TSVs are used as an example, other communication pathways apart from wire bonds and TSVs are also within the scope of the invention.

Figure 4:
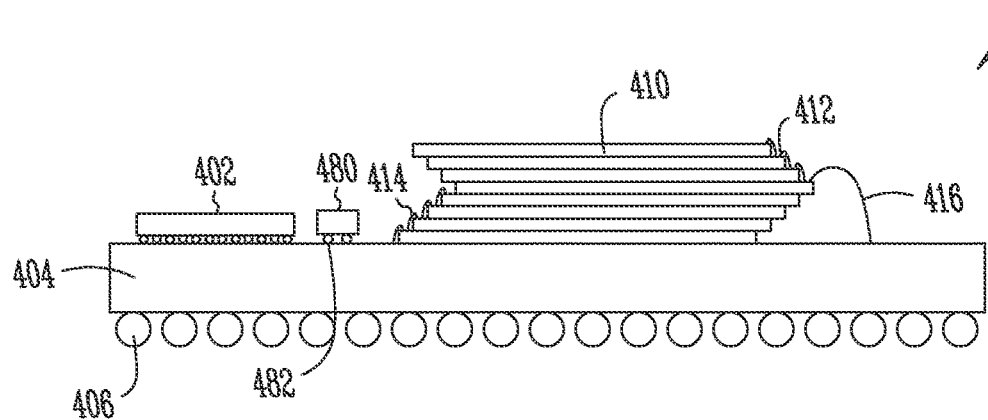
FIG. 4 illustrates another memory device in accordance with some example embodiments.

FIG. 4 shows another example of a memory device 400. The memory device 400 includes a buffer 402 coupled to a substrate 404. The memory device 400 also includes a stack of DRAM dies 410 coupled to the substrate 404. In the example of FIG. 4, the stack of DRAM dies 410 are staggered in at least one stair step configuration. The Example of FIG. 4 shows two different stagger directions in the stair stepped stack of DRAM dies 410. Similar to the configuration of FIG. 2, in the illustrated stair step configuration, an exposed surface portion 412 is used for a number of wire bond interconnections.

A multiplexer circuit 480 is shown coupled to the substrate 404 with one or more solder balls 482. The multiplexer circuit 480 is coupled between the buffer 402 and the stack of DRAM dies 410. Although the multiplexer circuit 480 is shown physically located between the buffer 402 and the stack of DRAM dies 410, the invention is not so limited. Although specific wiring is not shown in the Figure, the multiplexer circuit 480 is operationally coupled between the buffer 402 and the stack of DRAM dies 410, similar to the operational coupling described above.

Multiple wire bond interconnections 414, 416 are shown from the dies in the stack of DRAM dies 410 to the substrate 404. Additional conductors (not shown) on or within the substrate 404 further couple the wire bond interconnections 414, 416 to the buffer 402. The buffer 402 is shown coupled to the substrate 404 using one or more solder interconnections, such as a solder ball array. A number of substrate solder interconnections 406 are further shown on a bottom side of the substrate 404 to further transmit signals and data from the buffer into a motherboard and eventually to a host device.

In the example of FIG. 4, the multiple wire bond interconnections 414, 416 are serially connected up the multiple stacked DRAM dies. In selected examples, a single wire bond may drive a load in more than one DRAM die. In such an example, the wire bond interconnections may be serially connected as shown in FIG. 4. In one example, a single wire bond may be serially connected to four DRAM dies. In one example, a single wire bond may be serially connected to eight DRAM dies. In one example, a single wire bond may be serially connected to sixteen DRAM dies. Other numbers of serially connected DRAM dies are also within the scope of the invention. Additionally, CA connections of the DRAM interface may be made to a first number of the DRAM dies, while the corresponding DQ connections of the DRAM interface may be made to a second number of the DRAM dies different from the first number.

Figure 5A:
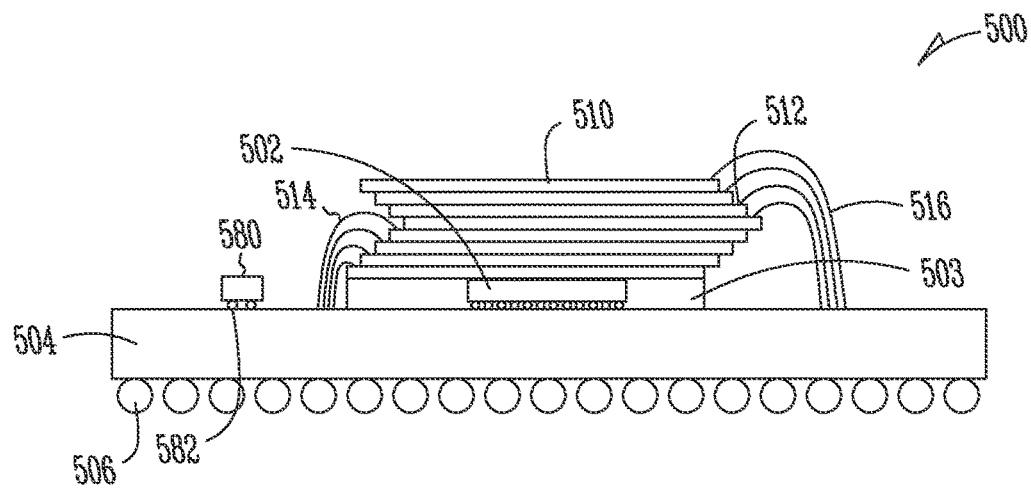
FIG. 5A illustrates another memory device in accordance with some example embodiments.

FIG. 5A shows another example of a memory device 500. The memory device 500 includes a buffer 502 coupled to a substrate 504. The memory device 500 also includes a stack of DRAM dies 510 coupled to the substrate 504. In the example of FIG. 5A, the stack of DRAM dies 510 are staggered in at least one stair step configuration. The Example of FIG. 5 shows two different stagger directions in the stair stepped stack of DRAM dies 510. In the illustrated stair step configuration, an exposed surface portion 512 is used for a number of wire bond interconnections.

A multiplexer circuit 580 is shown coupled to the substrate 504 with one or more solder balls 582. The multiplexer circuit 580 is coupled between the buffer 502 and the stack of DRAM dies 510. Although specific wiring is not shown in the Figure, the multiplexer circuit 580 is operationally coupled between the buffer 502 and the stack of DRAM dies 510, similar to the operational coupling described above.

Multiple wire bond interconnections 514, 516 are shown from the dies in the stack of DRAM dies 410 to the substrate 404. Additional conductors (not shown) on or within the substrate 504 further couple the wire bond interconnections 514, 451616 to the buffer 502. The buffer 502 is shown coupled to the substrate 504 using one or more solder interconnections, such as a solder ball array. A number of substrate solder interconnections 506 are further shown on a bottom side of the substrate 504 to further transmit signals and data from the buffer into a motherboard and eventually to a host device.

In the example of FIG. 5A, the buffer 502 is located at least partially underneath the stack of DRAM dies 510. In one example, an encapsulant 503 at least partially surrounds the buffer 502. The example of FIG. 5A further reduces an areal footprint of the memory device 500. Further, an interconnect distance between the stack of DRAM dies 510 and the buffer 502 is reduced.

Figure 5B:
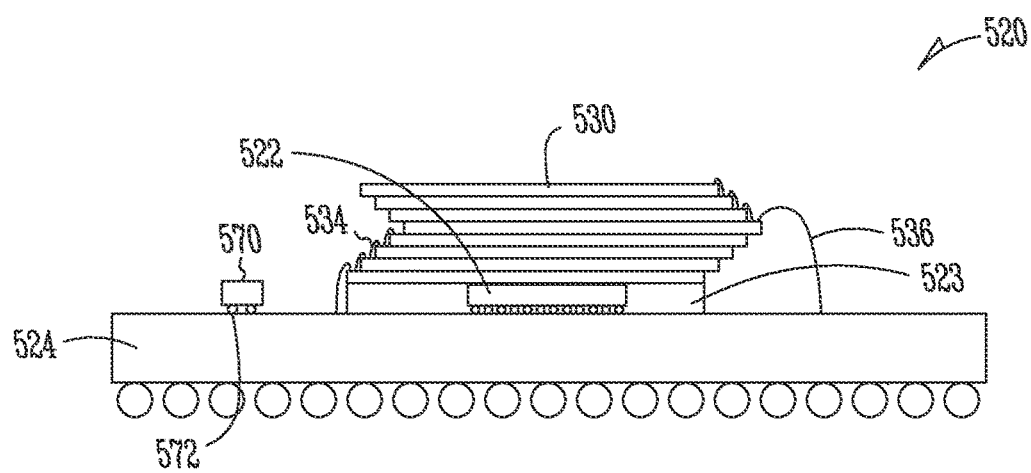
FIG. 5B illustrates another memory device in accordance with some example embodiments.

FIG. 5B shows another example of a memory device 520. The memory device 520 includes a buffer 522 coupled to a substrate 524. The memory device 520 also includes a stack of DRAM dies 530 coupled to the substrate 524. Multiple wire bond interconnections 534, 536 are shown from the dies in the stack of DRAM dies 530 to the substrate 524. In the example of FIG. 5B, the multiple wire bond interconnections 534, 536 are serially connected up the multiple stacked DRAM dies. In one example, a single wire bond may be serially connected to four DRAM dies. In one example, a single wire bond may be serially connected to eight DRAM dies. In one example, a single wire bond may be serially connected to sixteen DRAM dies. Other numbers of serially connected DRAM dies are also within the scope of the invention.

A multiplexer circuit 570 is shown coupled to the substrate 524 with one or more solder balls 572. The multiplexer circuit 570 is coupled between the buffer 522 and the stack of DRAM dies 530. Although specific wiring is not shown in the Figure, the multiplexer circuit 570 is operationally coupled between the buffer 522 and the stack of DRAM dies 530, similar to the operational coupling described above.

Figure 5C:
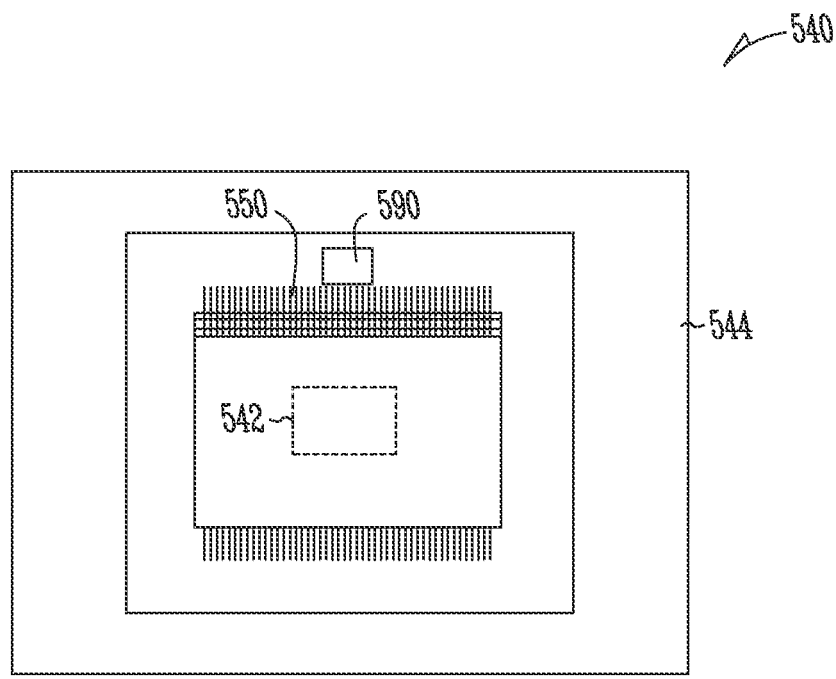
FIG. 5C illustrates another memory device in accordance with some example embodiments.
Figure 5D:
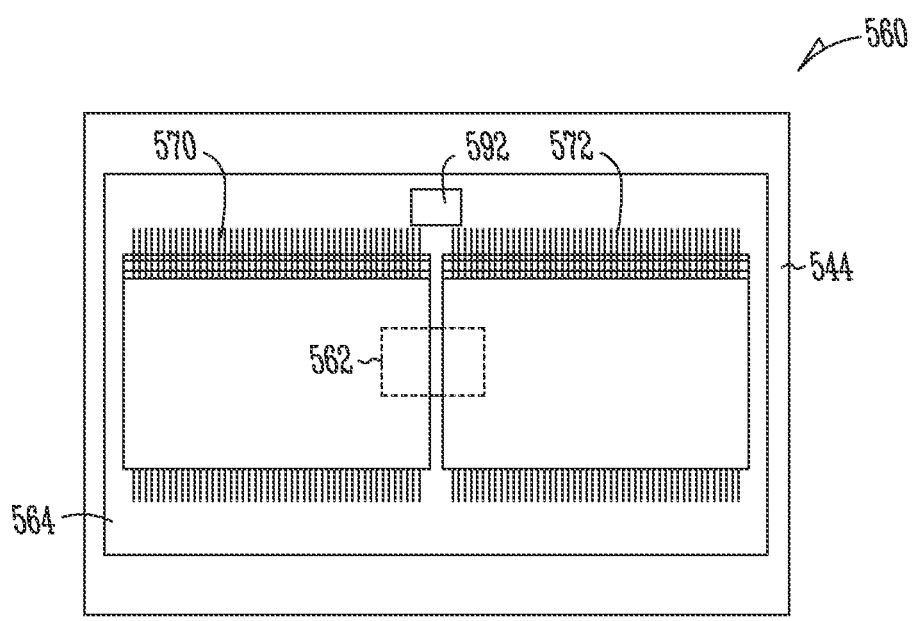
FIG. 5D illustrates another memory device in accordance with some example embodiments.

FIG. 5C shows a top view of a memory device 540 similar to memory devices 500 and 520. In the example of FIG. 5C, a buffer 542 is shown coupled to a substrate 544, and located completely beneath a stack of DRAM dies 550. FIG. 5D shows a top view of a memory device 560 similar to memory devices 500, 520, and 540. In FIG. 5D, a buffer 562 is coupled to a substrate 564, and located partially underneath a portion of a first stack of DRAM dies 570 and a second stack of DRAM dies 572. In one example, a shorter stack of DRAM dies provides a shorter interconnection path, and a higher manufacturing yield. In selected examples, it may be desirable to use multiple shorter stacks of DRAM dies for these reasons. One tradeoff of multiple shorter stacks of DRAM dies is a larger areal footprint of the memory device 560.

In FIG. 5C, a multiplexer circuit 590 is shown coupled to the substrate 544. In FIG. 5D, a multiplexer circuit 592 is shown coupled to the substrate 564. The multiplexer circuit 590 is coupled between the buffer 542 and the stack of DRAM dies 550. The multiplexer circuit 592 is coupled between the buffer 562 and the two stacks of DRAM dies 570, 572. Although specific wiring is not shown in the Figures, the multiplexer circuits 590, 592 are operationally coupled between respective buffers 542, 562 and DRAM dies, similar to the operational couplings described above.

Figure 6:
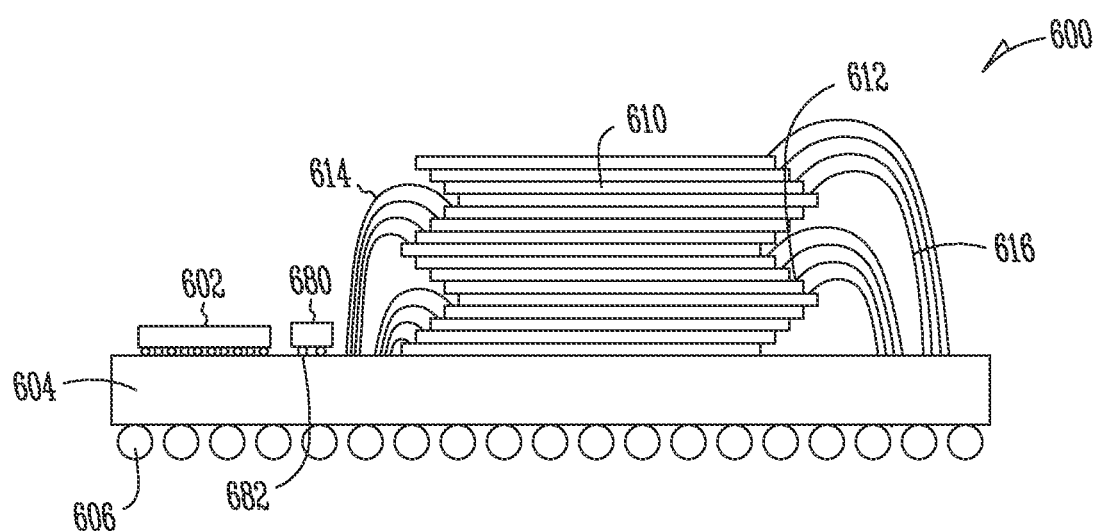
FIG. 6 illustrates another memory device in accordance with some example embodiments.

FIG. 6 shows another example of a memory device 600. The memory device 600 includes a buffer 602 coupled to a substrate 604. The memory device 600 also includes a stack of DRAM dies 610 coupled to the substrate 604. In the example of FIG. 6, the stack of DRAM dies 610 are staggered in at least one stair step configuration. The Example of FIG. 6 shows four staggers, in two different stagger directions in the stair stepped stack of DRAM dies 610. The stack of DRAM dies 610 in FIG. 6 includes 16 DRAM dies, although the invention is not so limited. Similar to other stair step configurations shown, in FIG. 6, an exposed surface portion 612 is used for a number of wire bond interconnections.

Multiple wire bond interconnections 614, 616 are shown from the dies in the stack of DRAM dies 610 to the substrate 604. Additional conductors (not shown) on or within the substrate 604 further couple the wire bond interconnections 614, 616 to the buffer 602. The buffer 602 is shown coupled to the substrate 604 using one or more solder interconnections, such as a solder ball array. A number of substrate solder interconnections 606 are further shown on a bottom side of the substrate 604 to further transmit signals and data from the buffer into a motherboard and eventually to a host device.

A multiplexer circuit 680 is shown coupled to the substrate 604 with one or more solder balls 682. The multiplexer circuit 680 is coupled between the buffer 602 and the stack of DRAM dies 610. Although specific wiring is not shown in the Figure, the multiplexer circuit 680 is operationally coupled between the buffer 602 and the stack of DRAM dies 610, similar to the operational couplings described above.

Figure 7:
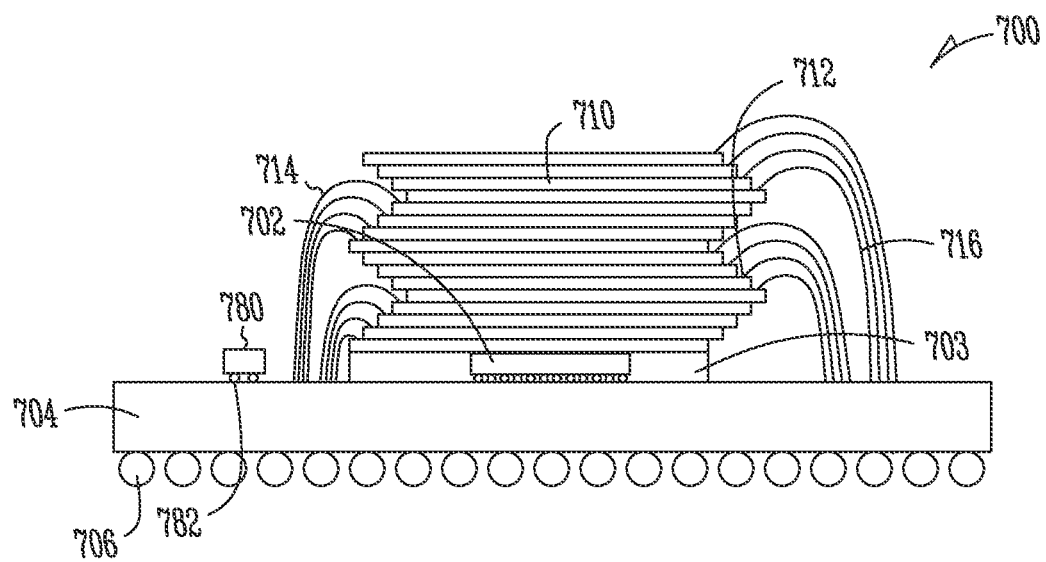
FIG. 7 illustrates another memory device in accordance with some example embodiments.

FIG. 7 shows another example of a memory device 700. The memory device 700 includes a buffer 702 coupled to a substrate 704. The memory device 700 also includes a stack of DRAM dies 710 coupled to the substrate 704. In the example of FIG. 7, the stack of DRAM dies 710 are staggered in at least one stair step configuration. The Example of FIG. 7 shows four staggers, in two different stagger directions in the stair stepped stack of DRAM dies 710. The stack of DRAM dies 710 in FIG. 7 includes 16 DRAM dies, although the invention is not so limited. Similar to other stair step configurations shown, in FIG. 7, an exposed surface portion 712 is used for a number of wire bond interconnections.

Multiple wire bond interconnections 714, 716 are shown from the dies in the stack of DRAM dies 710 to the substrate 704. Additional conductors (not shown) on or within the substrate 704 further couple the wire bond interconnections 714, 716 to the buffer 702. The buffer 702 is shown coupled to the substrate 704 using one or more solder interconnections, such as a solder ball array. A number of substrate solder interconnections 706 are further shown on a bottom side of the substrate 704 to further transmit signals and data from the buffer into a motherboard and eventually to a host device.

A multiplexer circuit 780 is shown coupled to the substrate 704 with one or more solder balls 782. The multiplexer circuit 780 is coupled between the buffer 702 and the stack of DRAM dies 710. Although specific wiring is not shown in the Figure, the multiplexer circuit 780 is operationally coupled between the buffer 702 and the stack of DRAM dies 710, similar to the operational couplings described above.

In the example of FIG. 7, the buffer 702 is located at least partially underneath the stack of DRAM dies 710. In one example, an encapsulant 703 at least partially surrounds the buffer 702. The example of FIG. 7 further reduces an areal footprint of the memory device 700. Additionally, an interconnect distance between the stack of DRAM dies 710 and the buffer 702 is reduced.

Figure 8A:
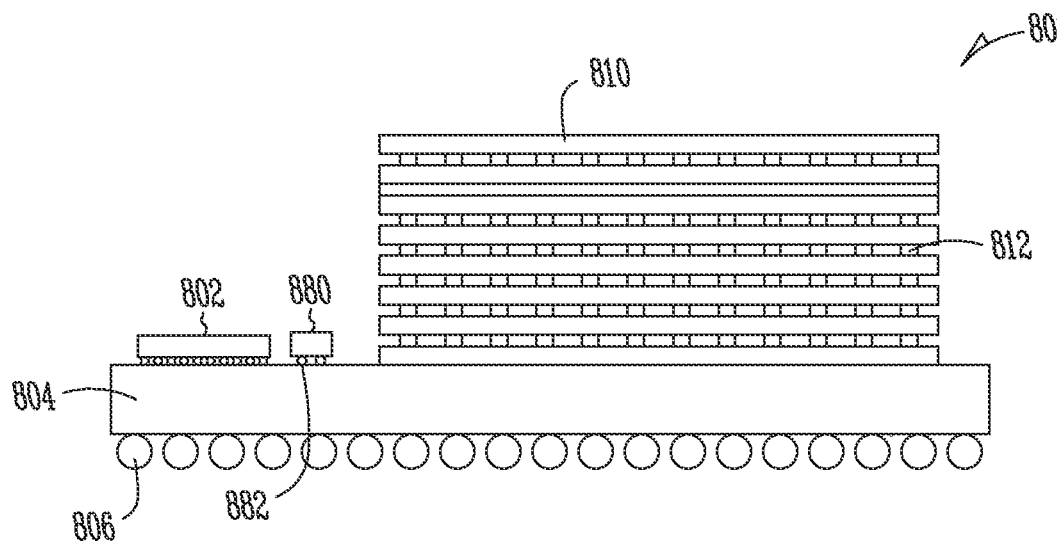
FIG. 8A illustrates another memory device in accordance with some example embodiments.

FIG. 8A shows another example of a memory device 800. The memory device 800 includes a buffer 802 coupled to a substrate 804. The memory device 800 also includes a stack of DRAM dies 810 coupled to the substrate 804. In the example of FIG. 8A, the stack of DRAM dies 810 are vertically aligned. The stack of DRAM dies 810 in FIG. 8A includes 8 DRAM dies, although the invention is not so limited.

Multiple TSV interconnections 812 are shown passing through, and communicating with one or more dies in the stack of DRAM dies 810 to the substrate 804. Additional conductors (not shown) on or within the substrate 804 further couple the TSVs 812 to the buffer 802. The buffer 802 is shown coupled to the substrate 804 using one or more solder interconnections, such as a solder ball array. A number of substrate solder interconnections 806 are further shown on a bottom side of the substrate 804 to further transmit signals and data from the buffer into a motherboard and eventually to a host device.

A multiplexer circuit 880 is shown coupled to the substrate 804 with one or more solder balls 882. The multiplexer circuit 880 is coupled between the buffer 802 and the stack of DRAM dies 810. Although the multiplexer circuit 880 is shown physically located between the buffer 802 and the stack of DRAM dies 810, the invention is not so limited. Although specific wiring is not shown in the Figure, the multiplexer circuit 880 is operationally coupled between the buffer 802 and the stack of DRAM dies 810, similar to the operational couplings described above.

Figure 8B:
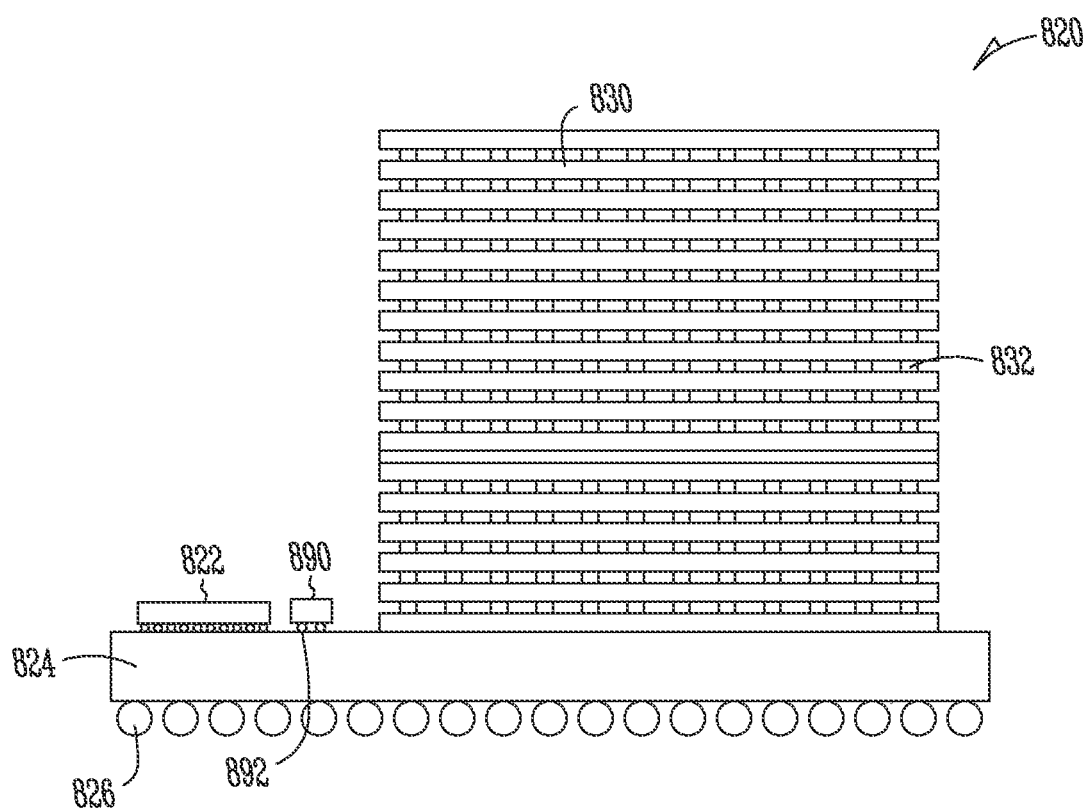
FIG. 8B illustrates another memory device in accordance with some example embodiments.

FIG. 8B shows another example of a memory device 820. The memory device 820 includes a buffer 822 coupled to a substrate 824. The memory device 820 also includes a stack of DRAM dies 830 coupled to the substrate 824. In the example of FIG. 8B, the stack of DRAM dies 830 are vertically aligned. The stack of DRAM dies 830 in FIG. 8B includes 16 DRAM dies, although the invention is not so limited.

Multiple TSV interconnections 832 are shown passing through, and communicating with one or more dies in the stack of DRAM dies 830 to the substrate 824. Additional conductors (not shown) on or within the substrate 824 further couple the TSVs 832 to the buffer 822. The buffer 822 is shown coupled to the substrate 824 using one or more solder interconnections, such as a solder ball array. A number of substrate solder interconnections 826 are further shown on a bottom side of the substrate 824 to further transmit signals and data from the buffer into a motherboard and eventually to a host device.

A multiplexer circuit 890 is shown coupled to the substrate 824 with one or more solder balls 892. The multiplexer circuit 890 is coupled between the buffer 822 and the stack of DRAM dies 830. Although the multiplexer circuit 890 is shown physically located between the buffer 822 and the stack of DRAM dies 830, the invention is not so limited. Although specific wiring is not shown in the Figure, the multiplexer circuit 890 is operationally coupled between the buffer 822 and the stack of DRAM dies 830, similar to the operational couplings described above.

Although preceding examples show a separate buffer and multiplexer circuit, the invention is not so limited. Any of the examples in the present disclosure may integrate two or more components. For example, a buffer and a multiplexer circuit may be integrated into a single die.

Figure 9A:
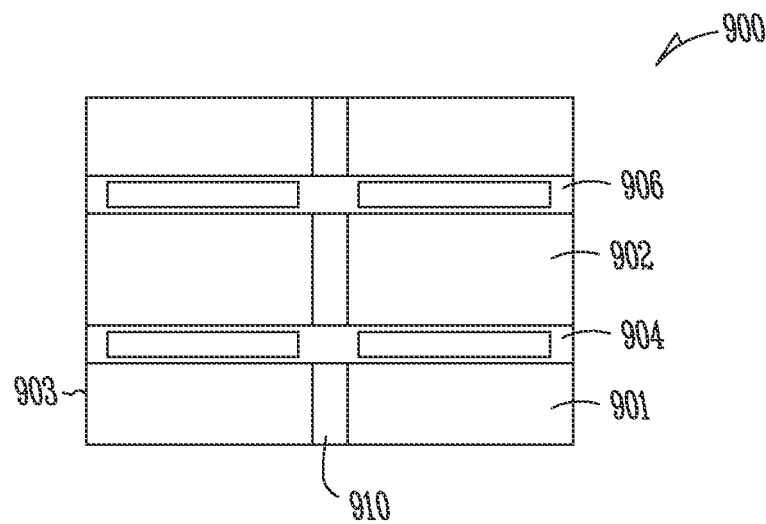
FIG. 9A illustrates a DRAM die configuration in accordance with some example embodiments.

FIG. 9A shows a block diagram of a single DRAM die 900 that may be included in a stack of DRAM dies according to any of the examples in the present disclosure. In FIG. 9A, the DRAM die 900 includes a storage region 902 that contains arrays of memory cells. A first data I/O stripe 904 is shown passing from a first side 901 to s second side 903 of the DRAM die 900. In one example, contacts may be formed on edges of the first data I/O stripe 904 on one or both sides 901, 903 of the first data I/O stripe 904. Contacts may be connected to wire bonds as described in examples above. In other examples, TSVs may be coupled to the first data I/O stripe 904, at sides 901, 903, or other locations along the first data I/O stripe 904.

A second data I/O stripe 906 is further shown in FIG. 9A. In one example, the second data I/O stripe 906 is substantially the same as the first data I/O stripe 904. In the example, of FIG. 9A, each data I/O stripe includes 36 contacts for connection to wire bonds on either side. With two data I/O stripes, and two sides each, the DRAM die 900 includes connections for 144 wire bonds or TSVs.

A command/address stripe 910 is further shown in FIG. 9A. In the example shown, the command/address stripe 910 includes 30 contacts for connection to wire bonds or TSVs. In one example, one or more of the DRAM dies may include a redistribution layer redistributing connections of one or more of the data I/O stripes 904, 906, 910 to a second location for wire bonding, such as to one or more rows of wire bond pads along an edge of the die (as depicted relative to the example wire bonded stack configurations discussed earlier herein).

Figure 9B:
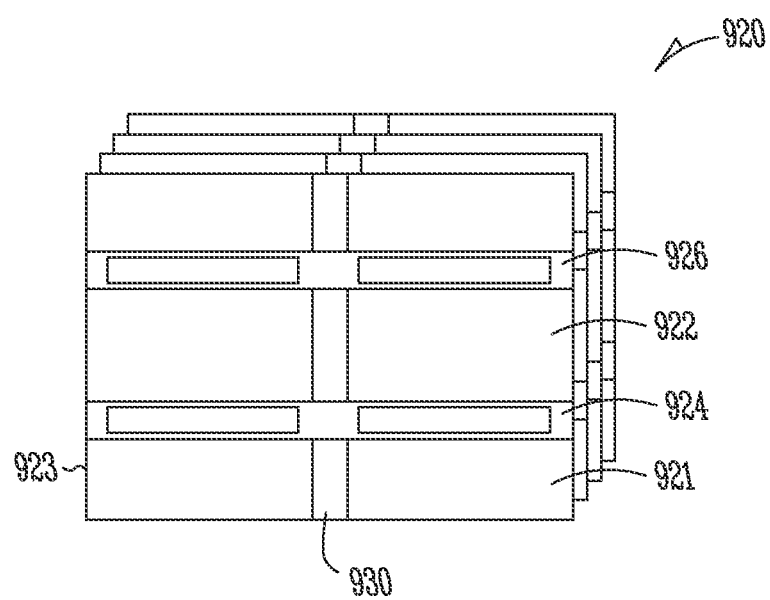
FIG. 9B illustrates another DRAM die configuration in accordance with some example embodiments.

FIG. 9B shows a block diagram of a stack of four DRAM dies 920 that may be included in a stack of DRAM dies according to any of the examples in the present disclosure. In FIG. 9B, each die in the stack 920 includes a storage region 922 that contains arrays of memory cells. A first data I/O stripe 924 is shown passing from a first side 921 to s second side 923 of the stack 920. In one example, contacts may be formed on edges of the first data I/O stripe 924 on one or both sides 921, 923 of the first data I/O stripe 924. Contacts may be connected to wire bonds as described in examples above. In other examples, TSVs may be coupled to the first data I/O stripe 924, at sides 921, 923, or other locations along the first data I/O stripe 924.

A second data I/O stripe 926 is further shown in FIG. 9B. In one example, the second data I/O stripe 926 is substantially the same as the first data I/O stripe 924. In the example, of FIG. 9B, each data I/O stripe includes 9 contacts for connection to wire bonds on either side. With two data I/O stripes, and two sides, each DRAM die in the stack 920 includes connections for 36 wire bonds or TSVs. In one example, all four of the dies in the stack 920 are driven by a single data path as described in examples above.

A command/address stripe 930 is further shown in FIG. 9B. In the example shown, the command/address stripe 930 includes 30 contacts for connection to wire bonds or TSVs.

Figure 9C:
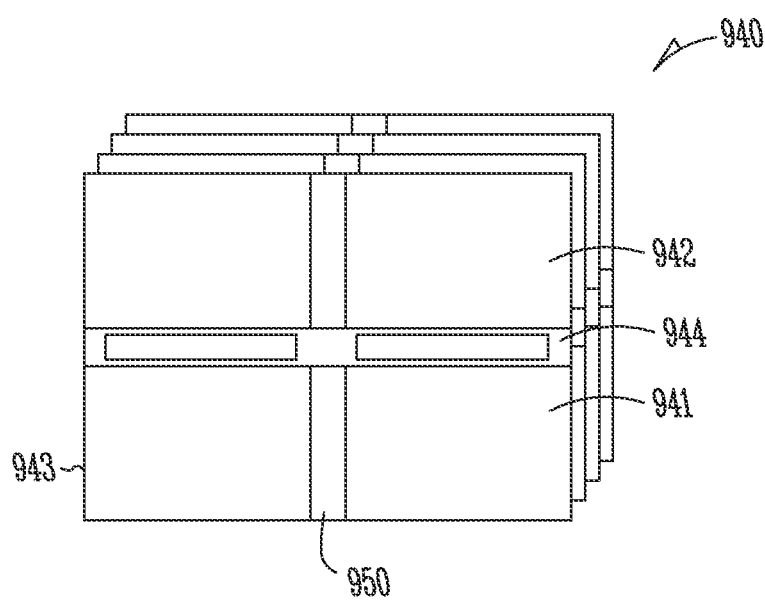
FIG. 9C illustrates another DRAM die configuration in accordance with some example embodiments.

FIG. 9C shows a block diagram of a stack of four DRAM dies 940 that may be included in a stack of DRAM dies according to any of the examples in the present disclosure. In FIG. 9C, each die in the stack 940 includes a storage region 942 that contains arrays of memory cells. A single data I/O stripe 944 is shown passing from a first side 941 to s second side 943 of the stack 940. In one example, contacts may be formed on edges of the data I/O stripe 944 on one or both sides 941, 943 of the data I/O stripe 944. Contacts may be connected to wire bonds as described in examples above. In other examples, TSVs may be coupled to the data I/O stripe 944, at sides 941, 943, or other locations along the first data I/O stripe 944.

In the example, of FIG. 9C, the single data I/O stripe 944 includes 18 contacts for connection to wire bonds on either side. With two sides, each DRAM die in the stack 940 includes connections for 36 wire bonds or TSVs. In one example, all four of the dies in the stack 940 are driven by a single data path as described in examples above.

A command/address stripe 950 is further shown in FIG. 9B. In the example shown, the command/address stripe 950 includes 30 contacts for connection to wire bonds or TSVs.

Figure 10A:
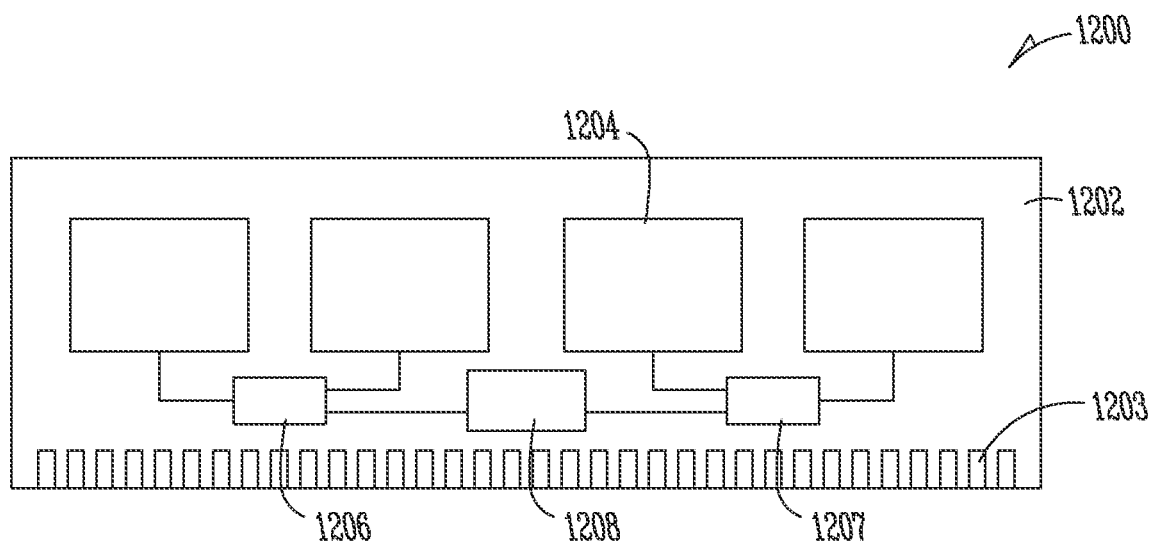
FIG. 10A illustrates a system including a memory device in accordance with some example embodiments.

FIG. 10A shows a memory system 1200 according to one example. IN the example of FIG. 10A, the memory system 1200 is in a DIMM form factor. The memory system 1200 includes a substrate 1202 and multiple memory devices 1204. The substrate 1202 includes multiple contacts 1203 for insertion in a DIMM socket.

In one example, a memory device 1204 includes a single memory die, such as a DRAM die or other memory die. In one example, a memory device 1204 includes a stack of memory dies, such as DRAM dies or other memory dies. In one example, a memory device 1204 include a stack of memory dies on a separate substrate with a buffer associated with the stacks of memory dies, similar to any of memory device described in the present disclosure, such as memory device 200, 400, 500, 520, 540, 560, 600, 700, 800, or 820.

A buffer 1208 is shown on the substrate 1202. In the example shown, a first multiplexer circuit 1206 and a second multiplexer circuit 1206 are shown coupled between the buffer 1208 and the memory devices 1204. Although two multiplexer circuits and four memory devices 1204 are shown, the invention is not so limited. Other numbers of multiplexer circuits and buffers may be used to accommodate different configurations and numbers of memory devices 1204. In the example shown in FIG. 10A, a DIMM configuration is self-contained, and includes its own buffer, multiplexer circuit and memory devices. The memory system 1200 will operate similar to other systems described above and provides increased ability for a fast host interface to interact with a large number of slower, wider bandwidth memory devices 1204.

Figure 10B:
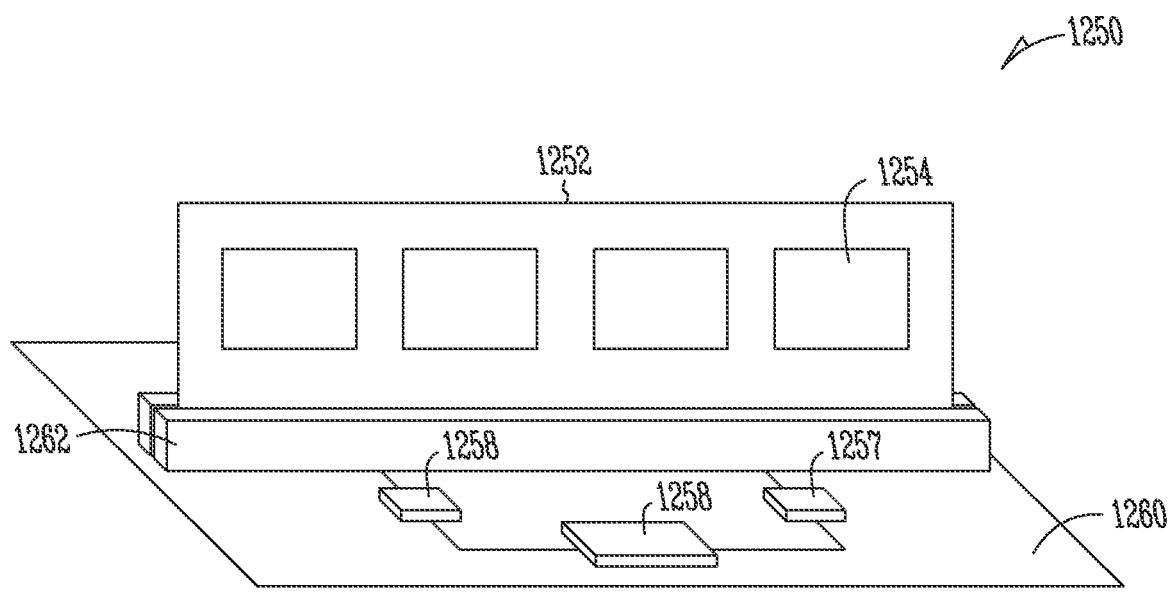
FIG. 10B illustrates another system including a memory device in accordance with some example embodiments.

FIG. 10B shows another memory system 1250 according to an example. The memory system 1250 includes a substrate 1252 with multiple memory devices 1254 attached to the substrate 1252. In the example shown, the substrate 1252 is a DIMM configuration, although the example is not so limited. The substrate 1252 is shown in place within a socket 1262. The socket is located on a second substrate 1260. In one example, the second substrate 1260 is a motherboard, although other intermediate boards are also within the scope of the invention. In the example of FIG. 10B, the second substrate 1260 includes a buffer 1258 and a first multiplexer circuit 1256. In one example, a second multiplexer circuit 1257 is further included.

In operation, data may be transmitted between a processor (not shown) and the buffer 1258. From the buffer 1258, the data is multiplexed between one or more multiplexer circuits (1256, 1257) and the multiple memory devices 1254. As described in other examples above, the inclusion of one or more multiplexer circuits facilitates a larger number of slower, wider bandwidth memory devices 1254 to interface with a faster host device such as a processor.

The location of the buffer 1258 and the one or more multiplexer circuits (1256, 1257) in FIG. 10B allows use of an existing memory device, such as a DIMM memory device and provides the optimization advantages of using a buffer and one or more multiplexer circuits as described above. Although a socket is included in the system, the buffer is still located between the multiple memory devices 1254 and a processor. The one or more multiplexer circuits (1256, 1257) are still located between the buffer 1258 and the multiple memory devices 1254.

Figure 11:
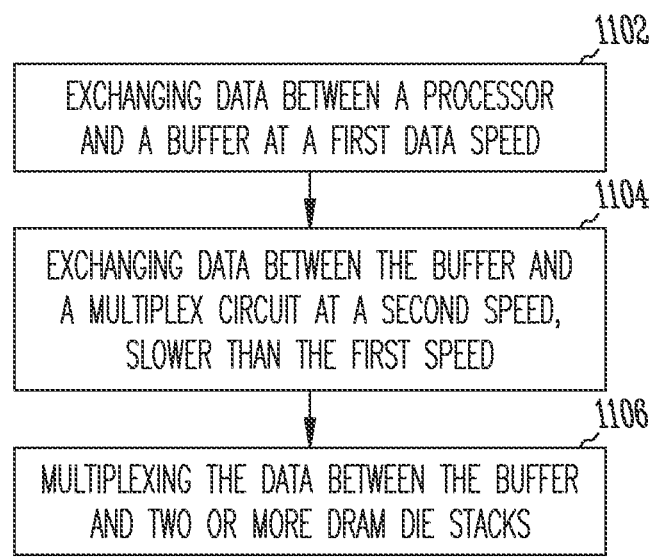
FIG. 11 illustrates an example method flow diagram in accordance with some example embodiments.

FIG. 11 shows a block diagram of one method of operation according to an embodiment of the invention. In operation 1102, data is exchanged between a processor and a buffer at a first data speed. In operation 1104, data is exchanged between the buffer and a multiplex circuit at a second speed, slower than the first speed. In operation 1106, the data is multiplexed between the buffer and two or more DRAM die stacks.

Figure 12:
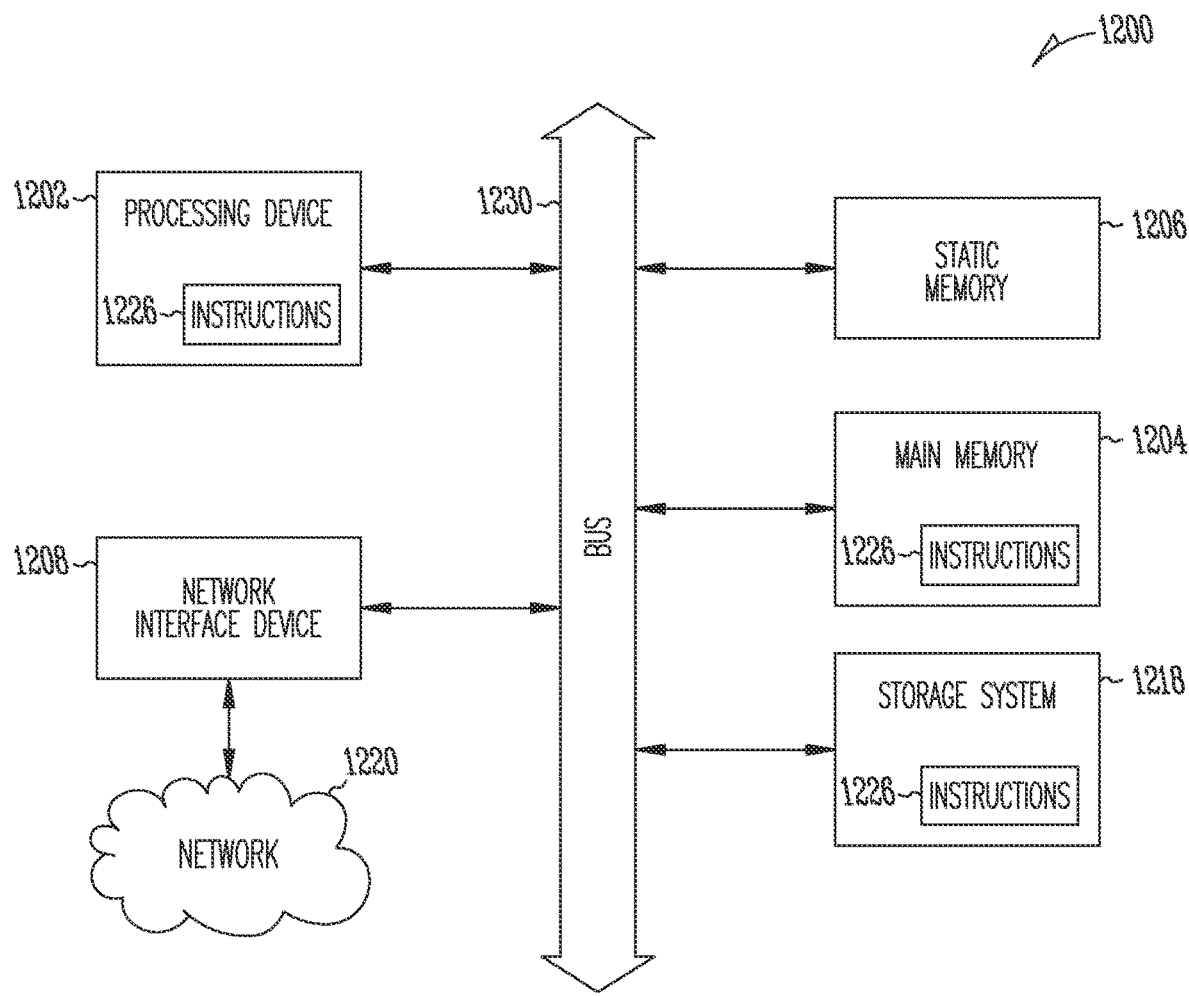
FIG. 12 illustrates an example block diagram of an information handling system in accordance with some example embodiments.

FIG. 12 illustrates a block diagram of an example machine (e.g., a host system) 1200 which may include one or more memory devices and/or systems as described above. In alternative embodiments, the machine 1200 may operate as a standalone device or may be connected (e.g., networked) to other machines. In a networked deployment, the machine 1200 may operate in the capacity of a server machine, a client machine, or both in server-client network environments. In an example, the machine 1200 may act as a peer machine in peer-to-peer (P2P) (or other distributed) network environment. The machine 1200 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible overtime and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine (e.g., computer system, a host system, etc.) 1200 may include a processing device 1202 (e.g., a hardware processor, a central processing unit (CPU), a graphics processing unit (GPU), a hardware processor core, or any combination thereof, etc.), a main memory 1204 (e.g., read-only memory (ROM), dynamic random-access memory (DRAM) such as synchronous DRAM (SDRAM) or Rambus DRAM (RDRAM), etc.), a static memory 1206 (e.g., static random-access memory (SRAM), etc.), and a storage system 1218, some or all of which may communicate with each other via a communication interface (e.g., a bus) 1230. In one example, the main memory 1204 includes one or more memory devices as described in examples above.

The processing device 1202 can represent one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 1202 can also be one or more special-purpose processing devices such as an application specific integrated circuit (ASIC), a field programmable gate array (FPGA), a digital signal processor (DSP), network processor, or the like. The processing device 1202 can be configured to execute instructions 1226 for performing the operations and steps discussed herein. The computer system 1200 can further include a network interface device 1208 to communicate over a network 1220.

The storage system 1218 can include a machine-readable storage medium (also known as a computer-readable medium) on which is stored one or more sets of instructions 1226 or software embodying any one or more of the methodologies or functions described herein. The instructions 1226 can also reside, completely or at least partially, within the main memory 1204 or within the processing device 1202 during execution thereof by the computer system 1200, the main memory 1204 and the processing device 1202 also constituting machine-readable storage media.

The term "machine-readable storage medium" should be taken to include a single medium or multiple media that store the one or more sets of instructions, or any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media. In an example, a massed machine-readable medium comprises a machine-readable medium with multiple particles having invariant (e.g., rest) mass. Accordingly, massed machine-readable media are not transitory propagating signals. Specific examples of massed machine-readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The machine 1200 may further include a display unit, an alphanumeric input device (e.g., a keyboard), and a user interface (UI) navigation device (e.g., a mouse). In an example, one or more of the display unit, the input device, or the UI navigation device may be a touch screen display. The machine a signal generation device (e.g., a speaker), or one or more sensors, such as a global positioning system (GPS) sensor, compass, accelerometer, or one or more other sensor. The machine 1200 may include an output controller, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The instructions 1226 (e.g., software, programs, an operating system (OS), etc.) or other data are stored on the storage system 1218 can be accessed by the main memory 1204 for use by the processing device 1202. The main memory 1204 (e.g., DRAM) is typically fast, but volatile, and thus a different type of storage than the storage system 1218 (e.g., an SSD), which is suitable for long-term storage, including while in an "off" condition. The instructions 1226 or data in use by a user or the machine 1200 are typically loaded in the main memory 1204 for use by the processing device 1202. When the main memory 1204 is full, virtual space from the storage system 1218 can be allocated to supplement the main memory 1204; however, because the storage system 1218 device is typically slower than the main memory 1204, and write speeds are typically at least twice as slow as read speeds, use of virtual memory can greatly reduce user experience due to storage system latency (in contrast to the main memory 1204, e.g., DRAM). Further, use of the storage system 1218 for virtual memory can greatly reduce the usable lifespan of the storage system 1218.

The instructions 1224 may further be transmitted or received over a network 1220 using a transmission medium via the network interface device 1208 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi, IEEE 802.16 family of standards known as WiMax®), IEEE 802.15.4 family of standards, peer-to-peer (P2P) networks, among others. In an example, the network interface device 1208 may include one or more physical jacks (e.g., Ethernet, coaxial, or phone jacks) or one or more antennas to connect to the network 1220. In an example, the network interface device 1208 may include multiple antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding, or carrying instructions for execution by the machine 1200, and includes digital or analog communications signals or other intangible medium to facilitate communication of such software.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventor also contemplates examples in which only those elements shown or described are provided. Moreover, the present inventor also contemplates examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

The term "horizontal" as used in this document is defined as a plane parallel to the conventional plane or surface of a substrate, such as that underlying a wafer or die, regardless of the actual orientation of the substrate at any point in time. The term "vertical" refers to a direction perpendicular to the horizontal as defined above. Prepositions, such as "on," "over," and "under" are defined with respect to the conventional plane or surface being on the top or exposed surface of the substrate, regardless of the orientation of the substrate; and while "on" is intended to suggest a direct contact of one structure relative to another structure which it lies "on" (in the absence of an express indication to the contrary); the terms "over" and "under" are expressly intended to identify a relative placement of structures (or layers, features, etc.), which expressly includes—but is not limited to—direct contact between the identified structures unless specifically identified as such. Similarly, the terms "over" and "under" are not limited to horizontal orientations, as a structure may be "over" a referenced structure if it is, at some point in time, an outermost portion of the construction under discussion, even if such structure extends vertically relative to the referenced structure, rather than in a horizontal orientation.

The terms "wafer" and "substrate" are used herein to refer generally to any structure on which integrated circuits are formed, and also to such structures during various stages of integrated circuit fabrication. The following detailed description is, therefore, not to be taken in a limiting sense, and the scope of the various embodiments is defined only by the appended claims, along with the full scope of equivalents to which such claims are entitled.

Various embodiments according to the present disclosure and described herein include memory utilizing a vertical structure of memory cells (e.g., NAND strings of memory cells). As used herein, directional adjectives will be taken relative a surface of a substrate upon which the memory cells are formed (i.e., a vertical structure will be taken as extending away from the substrate surface, a bottom end of the vertical structure will be taken as the end nearest the substrate surface and a top end of the vertical structure will be taken as the end farthest from the substrate surface).

As used herein, directional adjectives, such as horizontal, vertical, normal, parallel, perpendicular, etc., can refer to relative orientations, and are not intended to require strict adherence to specific geometric properties, unless otherwise noted. For example, as used herein, a vertical structure need not be strictly perpendicular to a surface of a substrate, but may instead be generally perpendicular to the surface of the substrate, and may form an acute angle with the surface of the substrate (e.g., between 60 and 120 degrees, etc.).

In some embodiments described herein, different doping configurations may be applied to a select gate source (SGS), a control gate (CG), and a select gate drain (SGD), each of which, in this example, may be formed of or at least include polysilicon, with the result such that these tiers (e.g., polysilicon, etc.) may have different etch rates when exposed to an etching solution. For example, in a process of forming a monolithic pillar in a 3D semiconductor device, the SGS and the CG may form recesses, while the SGD may remain less recessed or even not recessed. These doping configurations may thus enable selective etching into the distinct tiers (e.g., SGS, CG, and SGD) in the 3D semiconductor device by using an etching solution (e.g., tetramethylammonium hydroxide (TMCH)).

Operating a memory cell, as used herein, includes reading from, writing to, or erasing the memory cell. The operation of placing a memory cell in an intended state is referred to herein as "programming," and can include both writing to or erasing from the memory cell (i.e., the memory cell may be programmed to an erased state).

According to one or more embodiments of the present disclosure, a memory controller (e.g., a processor, controller, firmware, etc.) located internal or external to a memory device, is capable of determining (e.g., selecting, setting, adjusting, computing, changing, clearing, communicating, adapting, deriving, defining, utilizing, modifying, applying, etc.) a quantity of wear cycles, or a wear state (e.g., recording wear cycles, counting operations of the memory device as they occur, tracking the operations of the memory device it initiates, evaluating the memory device characteristics corresponding to a wear state, etc.)

According to one or more embodiments of the present disclosure, a memory access device may be configured to provide wear cycle information to the memory device with each memory operation. The memory device control circuitry (e.g., control logic) may be programmed to compensate for memory device performance changes corresponding to the wear cycle information. The memory device may receive the wear cycle information and determine one or more operating parameters (e.g., a value, characteristic) in response to the wear cycle information.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. If two elements are shown in the drawings with a line connecting them, the two elements can be either be coupled, or directly coupled, unless otherwise indicated.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

To better illustrate the method and apparatuses disclosed herein, a non-limiting list of embodiments is provided here:

Example 1 is a memory device. The memory device includes a buffer including a host device interface, and a DRAM interface, one or more DRAM dies, and a multiplexer circuit coupled between the one or more DRAM dies and the DRAM interface.

In Example 2, the subject matter of Example 1 is optionally configured to further include circuitry in the buffer, configured to operate the host interface at a first data speed, and to operate the DRAM interface at a second data speed, slower than the first data speed.

In Example 3, the subject matter of any of Examples 1-2 is optionally configured such that the one or more DRAM dies includes two or more separate memory die stacks, wherein each of the two or more memory die stacks are coupled to the multiplexer circuit.

In Example 4, the subject matter of any of Examples 1-3 is optionally configured such that the multiplexer circuit is configured to multiplex a plurality of data pins, wherein a number of data pins on the DRAM interface is related to a number of pins on the host interface by a ratio between the second data speed and the first data speed.

In Example 5, the subject matter of any of Examples 1-4 is optionally configured such that the multiplexer circuit is configured to multiplex a plurality of command/address pins, wherein a number of command/address pins on the DRAM interface is related to a number of pins on the host interface by a ratio between the second data speed and the first data speed.

In Example 6, the subject matter of any of Examples 1-5 is optionally configured to further include a command/address pin configured to select a die stack from the two or more die stacks.

In Example 7, the subject matter of any of Examples 1-6 is optionally configured such that the buffer and the multiplexer circuit are located on a common substrate.

In Example 8, the subject matter of any of Examples 1-7 is optionally configured to further include a socket between the multiplexer circuit and the one or more DRAM dies.

In Example 9, the subject matter of any of Examples 1-8 is optionally configured such that the multiplexer circuit and buffer are integrated in a single die.

In Example 10, the subject matter of any of Examples 1-9 is optionally configured such that the multiplexer circuit and buffer are located directly on a motherboard.

In Example 11, the subject matter of any of Examples 1-10 is optionally configured such that the one or more DRAM dies includes one or more DDR6 DRAM dies.

In Example 12, the subject matter of any of Examples 1-11 is optionally configured such that two multiplexer circuits are included with one multiplexer circuit on either side of the one or more DRAM dies.

In Example 13, the subject matter of any of Examples 1-12 is optionally configured such that the one or more DRAM dies includes eight DRAM dies and wherein four multiplexer circuits are included with two DRAM dies associated with each multiplexer circuit.

In Example 14, the subject matter of any of Examples 1-13 is optionally configured such that the one or more DRAM dies includes sixteen DRAM dies and wherein four multiplexer circuits are included with four DRAM dies associated with each multiplexer circuit.

Example 15 is a memory system. The memory system includes two or more memory devices, each memory device including, a buffer coupled to a substrate, the buffer including a host device interface, and a DRAM interface, one or more DRAM dies supported by the substrate, multiple wire bond interconnections between the DRAM interface of the buffer and the one or more DRAM dies, circuitry in the buffer, configured to operate the host interface at a first data speed, and to operate the DRAM interface at a second data speed, slower than the first data speed, and a multiplexer circuit coupled between a host controller and the host interfaces of the two or more memory devices.

In Example 16, the subject matter of Example 15 is optionally configured to further include a command/address pin configured to select one of the two or more memory devices.

In Example 17, the subject matter of any of Examples 15-16 is optionally configured such that the two or more memory devices are arranged on a board in a DIMM configuration.

In Example 18, the subject matter of any of Examples 15-17 is optionally configured such that the one or more DRAM dies includes one or more DDR6 DRAM dies.

In Example 19, the subject matter of any of Examples 15-18 is optionally configured such that the two or more memory devices includes four memory devices and wherein two multiplexer circuits are included with two memory devices associated with each multiplexer circuit.

In Example 20, the subject matter of any of Examples 15-19 is optionally configured such that the multiplexer circuit is coupled directly to a motherboard.

Example 21 is a memory system. The memory system includes a processor coupled to a first substrate, a memory device coupled to the first substrate adjacent to the processor, the memory device including a buffer including a host device interface, and a DRAM interface, one or more DRAM dies, a multiplexer circuit coupled between the one or more DRAM dies and the DRAM interface, and circuitry in the buffer, configured to operate the host interface at a first data speed, and to operate the DRAM interface at a second data speed, slower than the first data speed.

In Example 22, the subject matter of Example 21 is optionally configured such that the first substrate is a motherboard, and the memory device and the processor are both soldered to the motherboard with a ball grid array.

In Example 23, the subject matter of any of Examples 21-22 is optionally configured such that the memory device is one of multiple memory devices soldered to the motherboard adjacent to the processor.

Example 24 is a method of operating a memory device. The method includes exchanging data between a processor and a buffer at a first data speed, exchanging data between the buffer and a multiplex circuit at a second speed, slower than the first speed, multiplexing the data between the buffer and two or more DRAM die stacks.

In Example 25, the subject matter of Example 24 is optionally configured such that multiplexing the data between the buffer and two or more DRAM die stacks includes multiplexing between two stacks of four DRAM dies each.

In Example 26, the subject matter of any of Examples 24-25 is optionally configured such that exchanging data between the buffer and the multiplex circuit includes exchanging data between a buffer and multiplex circuit both located on a single die.

In Example 27, the subject matter of any of Examples 24-26 is optionally configured such that multiplexing the data between the buffer and two or more DRAM die stacks includes utilizing a dedicated CA (command/address) pin to select between die stacks in the multiplexing operation.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A memory device, comprising:
   a buffer including a host device interface, and a DRAM interface;
   one or more DRAM dies;
   a multiplexer circuit coupled between the one or more DRAM dies and the buffer; and
   circuitry in the buffer, configured to operate the host interface at a first data speed, and to operate the DRAM interface at a second data speed, slower than the first data speed.

2. The memory device of claim 1, wherein the one or more DRAM dies includes two or more separate memory die stacks, each comprising a plurality of DRAM die coupled to the buffer, the multiplexer, or to one another, or a combination thereof, with at least one wire bond, wherein each of the two or more memory die stacks are coupled to the multiplexer circuit.

3. The memory device of claim 1, wherein the multiplexer circuit is configured to multiplex a plurality of data pins, wherein a number of data pins on the DRAM interface is related to a number of pins on the host interface by a ratio between the second data speed and the first data speed.

4. The memory device of claim 1, wherein the multiplexer circuit is configured to multiplex a plurality of command/address pins, wherein a number of command/address pins on the DRAM interface is related to a number of pins on the host interface by a ratio between the second data speed and the first data speed.

5. The memory device of claim 1, further including a command/address pin configured to select a die stack from the two or more die stacks.

6. The memory device of claim 1, wherein the buffer and the multiplexer circuit are located on a common substrate.

7. The memory device of claim 1, further including a socket between the multiplexer circuit and the one or more DRAM dies.

8. The memory device of claim 1, wherein the multiplexer circuit and buffer are integrated in a single die.

9. The memory device of claim 1, wherein the multiplexer circuit and buffer are located directly on a motherboard.

10. The memory device of claim 1, wherein the one or more DRAM dies includes one or more DDR6 DRAM dies.

11. The memory device of claim 1, including two multiplexer circuits with one multiplexer circuit on either side of the one or more DRAM dies.

12. The memory device of claim 1, wherein the one or more DRAM dies includes eight DRAM dies and wherein four multiplexer circuits are included with two DRAM dies associated with each multiplexer circuit.

13. The memory device of claim 1, wherein the one or more DRAM dies includes sixteen DRAM dies and wherein four multiplexer circuits are included with four DRAM dies associated with each multiplexer circuit.

14. A memory system, comprising:
   two or more memory devices, each memory device including:
   a buffer coupled to a substrate, the buffer including a host device interface, and a DRAM interface;
   one or more DRAM dies supported by the substrate;
   multiple wire bond interconnections between the DRAM interface of the buffer and the one or more DRAM dies;
   circuitry in the buffer, configured to operate the host interface at a first data speed, and to operate the DRAM interface at a second data speed, slower than the first data speed; and
   a multiplexer circuit coupled between a host controller and the buffers of each of the two or more memory devices.

15. The memory system of claim 14, further including a command/address pin configured to select one of the two or more memory devices.

16. The memory system of claim 15, wherein the two or more memory devices are arranged on a board in a DIMM configuration.

17. The memory system of claim 14, wherein the one or more DRAM dies includes one or more DDR6 DRAM dies.

18. The memory system of claim 14, wherein the two or more memory devices includes four memory devices and wherein two multiplexer circuits are included, wherein a first two of the four memory devices are associated with a first of the two multiplexer circuits, and wherein a remaining two of the four memory devices are associated with a second of the two multiplexer circuits.

19. The memory system of claim 14, wherein the multiplexer circuit is coupled directly to a motherboard.

20. A system, comprising:
   a processor coupled to a first substrate;
   a memory device coupled to the first substrate adjacent to the processor, the memory device including:
   a buffer including a host device interface, and a DRAM interface;
   one or more DRAM dies;
   a multiplexer circuit coupled between the one or more DRAM dies and the DRAM interface buffer; and
   circuitry in the buffer, configured to operate the host interface at a first data speed, and to operate the DRAM interface at a second data speed, slower than the first data speed.

21. The system of claim 20, wherein the first substrate is a motherboard, and the memory device and the processor are both soldered to the motherboard with a ball grid array.

22. The system of claim 20, wherein the memory device is one of multiple memory devices soldered to the motherboard adjacent to the processor.

23. A method of operating a memory device, comprising:
- exchanging data between a processor and a buffer at a first data speed;
- exchanging data between the buffer and a multiplex circuit at a second speed, slower than the first speed; and
- multiplexing the data between the buffer and two or more DRAM die stacks.

24. The method of claim 23, wherein multiplexing the data between the buffer and two or more DRAM die stacks includes multiplexing between two stacks of four DRAM dies each.

25. The method of claim 23, wherein exchanging data between the buffer and the multiplex circuit includes exchanging data between a buffer and multiplex circuit both located on a single die.

26. The method of claim 23, wherein multiplexing the data between the buffer and two or more DRAM die stacks includes utilizing a dedicated CA (command/address) pin to select between die stacks in the multiplexing operation.

* * * * *